United States Patent
Oshima

(10) Patent No.: US 7,078,889 B2
(45) Date of Patent: Jul. 18, 2006

(54) SEMICONDUCTOR TEST APPARATUS FOR TESTING SEMICONDUCTOR DEVICE THAT PRODUCES OUTPUT DATA BY ITS INTERNAL CLOCK TIMING

(75) Inventor: Hideyuki Oshima, Tokyo (JP)

(73) Assignee: Advantest Corp., Tokyo (JP)

( * ) Notice: Subject to any disclaimer, the term of this patent is extended or adjusted under 35 U.S.C. 154(b) by 0 days.

(21) Appl. No.: 10/507,042

(22) PCT Filed: Dec. 26, 2003

(86) PCT No.: PCT/JP03/16900

§ 371 (c)(1),
(2), (4) Date: Sep. 7, 2004

(87) PCT Pub. No.: WO2004/061465

PCT Pub. Date: Jul. 22, 2004

(65) Prior Publication Data

US 2005/0149801 A1    Jul. 7, 2005

(30) Foreign Application Priority Data

Dec. 27, 2002 (JP) .............................. 2002-381785

(51) Int. Cl.
*G01R 31/26* (2006.01)
(52) U.S. Cl. .................................. 324/158.1; 324/765
(58) Field of Classification Search ...................... None
See application file for complete search history.

(56) References Cited

U.S. PATENT DOCUMENTS 6,920,470 B1 *  7/2005  Page et al. .................. 708/300
2001/0052097 A1  12/2001  Miura

* cited by examiner

*Primary Examiner*—Minh N. Tang
(74) *Attorney, Agent, or Firm*—Muramatsu & Associates

(57) ABSTRACT

A recovery clock synchronized with an internal clock faster than a system clock is obtained with an edge timing of the system clock output from a DUT. The present invention includes: a time interpolator 20 which includes flip-flops (FF 21) which receive system clocks of the DUT 1, a delay circuit 22 which outputs time-series level data, from the FF 21, and an encoder 28 which receives the time-series level data output and encodes it into positional data indicative of an edge timing; a digital filter 40 which includes a plurality of registers 41 which sequentially store the positional data and output the positional data as a recovery clock; and a data side selector 30 which selects output data of the DUT 1 base on the recovery clock.

10 Claims, 9 Drawing Sheets

SEMICONDUCTOR TEST APPARATUS FOR TESTING SEMICONDUCTOR DEVICE THAT PRODUCES OUTPUT DATA BY ITS INTERNAL CLOCK TIMING

TECHNICAL FIELD

The present invention relates to a semiconductor test apparatus which judges whether a device under test is good or failed by comparing output data output from the device under test with predetermined expectation value data, and more particularly to a semiconductor test apparatus which is suitable for a test of a high-speed device as typified by, e.g., an ODR (Octal Data Rate) type device which outputs data at a data rate of an internal clock whose speed is higher than that of a system clock of the device.

BACKGROUND ART

In general, a semiconductor test apparatus (LSI tester) which runs a test of a semiconductor device inputs a predetermined test pattern signal to a device under test (DUT) as a test target, compares output data output from the device under test with a predetermined expectation value pattern signal, and judges match or mismatch, thereby detecting and judging the quality of the device under test.

This type of semiconductor test apparatus will now be described with reference to FIG. 7. This drawing is a block diagram showing a schematic structure of a conventional general semiconductor test apparatus (LSI tester).

As shown in the drawing, the conventional LSI tester 110 has a level comparator 111 which compares output data from a device under test (DUT) 101 with a comparison voltage in level, a pattern comparator 112 which compares the output data from the device under test 101 with a predetermined expectation value, a flip-flop 121 which is used to input the output data from the device under test 101 to the pattern comparator 112 with a predetermined timing.

In the conventional semiconductor test apparatus having such a structure, a predetermined test pattern signal is first input to the device under test 101 from a non-illustrated pattern generator, and a resultant signal is output as output data from the device under test 101. The output data output from the device under test 101 is input to the level comparator 111. The output that is input to the level comparator 111 is compared with a comparison voltage in level, and output to the flip-flop 121.

In. the flip-flop 121, a signal from the level comparator 111 is held as input data, a strobe from a non-illustrated timing generator is used as a clock signal, and output data is output with a predetermined timing. The output data output from the flip-flop 121 is input to the pattern comparator 112 and compared with predetermined expectation value data output from the pattern generator in the tester, and a comparison result is output. Based on this comparison result, match or mismatch between the output data and the expectation value is detected, and the quality (Pass/Fail) of the device under test 102 is judged.

As described above, in the conventional semiconductor test apparatus (LSI tester), the output data output from the device under test is acquired with a timing of a strobe output with a timing preset in the tester, and this strobe is used as a timing signal output from the timing generator provided independently from the device under test. However, in the conventional semiconductor test apparatus which acquires output data of the device under test by using the independent timing signal output from the tester in this manner, there arises a problem that, for a device having a function for generating an internal clock faster than a system clock, it is impossible to test such a high-speed device which outputs output data with a timing of this internal clock.

In recent years, the progress in increasing a speed of LSIs is significant, and a new semiconductor device as typified by, e.g., an ODR (Octal Data Rate) type device is introduced in order to increase a speed of data transfer. In this type of device, as shown in FIG. 9, an internal clock having a frequency which is n-fold of that of a system clock of a device 101 is generated by a PLL circuit or the like, and data is output with a timing of the internal clock which is faster than the system clock. For example, in the ODR type device, the internal clock which is fourfold of the system clock is generated, and data is output at a DDR (Double Data Rate) in synchronization with both edges, i.e., a rise edge and a fall edge of this internal clock. As a result, data output at a data rate which is eightfold of that of the system clock is realized. The DDR is a mode which performs data transfer with both timings of the rise edge and the fall edge of each internal clock signal, and enables double data transfer with the same clock cycle as compared with an SDR (Single Data Rate) mode which performs data transfer only at the rise edge (or the fall edge) of the internal clock.

In case of performing a test with respect to such a device, data must be acquired with timings of both of the rise edge and the fall edge of a system clock of the, device and at a data rate of an internal clock output at a frequency which is several-fold of that of the system clock.

As described above, however, in the conventional semiconductor test apparatus, output data from the device under test is acquired by using a timing signal output from a timing generator provided independently from the device under test. Therefore, it is impossible to acquire output data with edge timings of a clock output from the device under test and to acquire it at a data rate of an internal clock with a frequency which is several-fold of that of a system clock.

That is, with the structure of the conventional semiconductor test apparatus, a test cannot be conducted with respect to a device which outputs data with edge timings of a system clock and at a data rate of an internal clock faster than a system clock.

The present invention is proposed in order to solve such a problem in the prior art, and it is an object of the present invention to provide a semiconductor test apparatus which enables a test of a device under test which outputs data with edge timings of a system clock and at a data rate of an internal clock faster than the system clock, e.g., a high-speed device as typified by an ODR (Octal Data Rate) type device by acquiring a system clock output from the device under test, and producing a recovery clock having a frequency of an internal clock faster than the system clock with a rise edge timing or a fall edge timing of the system clock.

DISCLOSURE OF THE INVENTION

To achieve this aim, a semiconductor test apparatus according to the present invention comprises a first time interpolator which receives a clock output from a device under test, acquires the clock by using a plurality of strobes having specified timing intervals, outputs the clock as time-series level data, selectively receives level data indicative of an edge timing of a rise edge and/or a fall edge of the level data, and outputs positional data indicative of an edge timing of the selected level data; a second time interpolator which receives output data output from the device under test, acquires the output data by using a plurality of strobes having specified timing intervals, and outputs the output data as time-series level data; a digital filter which receives and holds the positional data output from the first time interpolator, and outputs a recovery clock indicative of a predetermined edge timing from one or more sets of the positional data; and a data selection circuit which receives the time-series level data output from the second time interpolator, selects the level data with an edge timing of the recovery clock output from the digital filter, and outputs the level data as measurement data of the device under test.

According to the semiconductor test apparatus of the present invention having such a structure, first, since the first and second time interpolators are provided, a clock and output data output from the device under test can be acquired as time-series level data. This time-series level data is indicative of an edge timing which is a signal change point of the clock (and the output data) of the device under test. Therefore, by inputting a system clock signal output from the device under test to the time interpolator and acquiring level data and positional data indicative of its edge timing, the positional data can be used as a timing signal which is utilized to acquire the output data of the device under test.

In the present invention particularly, an edge selector is provided, and the time-series level data acquired by the time interpolator can be selectively output as level data indicative of a timing of ① a rise edge of a clock, ② a fall edge or ③ both of a rise edge and a fall edge. As a result, the output data can be fetched with the edge timings of both the rise edge and the fall edge of the clock of the device under test, thereby also coping with a DDR type device.

Further, by enabling selective output of the level data in accordance with the rise edge and the fall edge of the clock, the output data can be fetched only by using the rise edge (or the fall edge) when the accuracy of the fall edge (or the rise edge) is poor in, e.g., a DDR type device.

Furthermore, in the test apparatus according to the present invention, by further providing a digital filter, positional data of a clock acquired by the time interpolator can be held, stored and output as a recovery clock corrected to have a desired timing of, e.g., a frequency which is n-fold of that of a system clock.

Level data and positional data indicative of an edge timing of a clock can be acquired by the first timer interpolator. However, for example, when the device under test outputs data in accordance with an internal clock having a frequency which is n-fold of that of a system clock, only one rise edge or fall edge can be detected in n cycles of the internal clock when an edge timing of the system clock having a 1/n frequency is obtained, and a signal change point (a rise edge or a fall edge) cannot be detected in any other cycle. As a result, the timing edge of the internal clock having an n-fold frequency can be detected for only once in n cycles.

Further, a clock signal output from the device under test has jitters, and an edge timing indicated by the obtained level data and positional data does not become a timing adequate as a timing signal used to acquire test data in some case.

Thus, by inputting and storing positional data of a system clock of the device under test obtained by the time interpolator into the digital filter, it is possible to output a clock signal indicative of an edge timing of a cycle corresponding to an internal clock having a frequency which is n-fold of that of a system clock, which is also a recovery clock corrected to a correct and adequate timing, for example. Furthermore, by providing a data selection circuit which selects output data of the device under test with this recovery clock being used as a selection signal, time-series level data of output data obtained by the time interpolator can be selected and output as measurement data which is compared with predetermined expectation value data.

As a result, even if the output data output from the device under test is output based on an internal clock faster than a system clock output from this device, and even if the system clock fluctuates due to jitters, a recovery clock indicative of an adequate edge timing can be output with a desired frequency.

As described above, according to the semiconductor test apparatus of the present invention, a desired recovery clock which is not dependent on influences or the like of a frequency of a system clock and its jitters of a device under test can be acquired, output data of the device under test can be fetched by using this recovery clock, and an accurate test can be easily and assuredly conducted even in case of a semiconductor device such as an ODR type device whose speed is increased.

Specifically, the first time interpolator comprises: a plurality of sequence circuits which receive clocks output from the device under test and which are connected with each other in parallel; a delay circuit which sequentially inputs strobes delayed at specified timing intervals to the plurality of sequence circuits, and outputs time-series level data from the sequence circuits; an edge selector which selectively outputs level data indicative of a rise edge of the time-series level data output from the plurality of sequence circuits, level data indicative of a fall edge of the same, or level data indicative of the rise edge and the fall edge of the same; and an encoder which receives the level data selected by the edge selector, encodes it into positional data indicative of an edge timing and outputs it, the digital filter comprises one or more registers which are connected with each other in series, sequentially store positional data output from the first time interpolator and output the stored positional data with a predetermined timing, and outputs a recovery clock indicative of a predetermined edge timing from one or more sets of positional data output from the registers, the second time interpolator comprises a plurality of sequence circuits connected with each other in parallel which receive output data output from the device under test; and a delay circuit which sequentially inputs strobes delayed at specified timing intervals to the plurality of sequence circuits and outputs time-series level data from the sequence circuits, and the data selection circuit comprises a selector which selects one set of data in the time-series level data input from the second time interpolator with the recovery clock output from the digital filter being used as a selection signal and outputs it as measurement data of the device under test.

Moreover, the edge selector comprises one or more selector circuits each of which includes: a first AND circuit which receives a reverse output of one sequence circuit and a non-reverse output of a sequence circuit on a next stage; a second AND circuit which receives a non-reverse output of one sequence circuit and a reverse output of a sequence circuit on a next stage; an OR circuit which receives outputs from the first and second AND circuits; and a selector which selects one of outputs from the first AND circuit, the second AND circuit and the OR circuit.

According to the semiconductor test apparatus of the present invention having the above-described structure, the first and second time interpolators including the edge selector, digital filter and the data selection circuit can be easily constituted by using existing means such as the sequence circuits, the delay circuit, the encoder, the registers, the selector, the AND circuits, the OR circuit or the like. As a result, the semiconductor test apparatus according to the present invention can be realized by using a simple structure without complication, increase in size, increase in cost and others of an LSI tester.

Additionally, according to the semiconductor test apparatus of the present invention constituted by the sequence circuits, the delay circuit and the registers as described above, a bit width (the number of sequence circuits or registers) or a resolution (delay quantity of the delay circuit) of the time-series level data or the positional data in the time interpolators and the digital filter can be set to arbitrary values by changing the number of sequence circuits or registers and a delay quantity of the delay circuit. As a result, various settings are enabled in accordance with a data rate, a jigger width or the like, and the semiconductor test apparatus with the high multiusability and convenience which can cope with any kind of LSI can be realized.

It is to be noted that the sequence circuits and the registers included in the time interpolators and the digital filter can be easily constituted by using existing circuits such as flip-flops or latches. However, it is possible to adopt any circuit structure as well as the flip-flops or the latches as long as output data from the device under test can be acquired at specified timing intervals and output as time-series level data and as long as positional data indicative of an edge timing can be held, stored and output with a predetermined timing.

Further, the semiconductor test apparatus according to the present invention has a structure in which the digital filter comprises an edge detection circuit which detects presence/absence of an edge of the positional data input from the first time interpolator, and outputs the positional data stored in the registers when the edge is detected.

According to the semiconductor test apparatus of the present invention having such a structure by providing the edge detection circuit, the only position data whose edge indicative of a signal change point is detected in positional data of clocks acquired by the first time interpolator can be stored in the registers as positional data which can be a reference of a recovery clock, and output.

For example, in case of a system clock of an ODR type device, its data rate is 1/8 of a data rate of the output data. Therefore, when only the positional data of the rise or fall edge of the system clock acquired by the first time interpolator is used, a signal change point (a rise edge and a fall edge) is detected once in eight rise and fall edges of the output data, and the output data output at an eightfold data rate cannot be acquired.

Thus, in the present invention, an edge detection circuit which detects presence/absence of an edge of positional data to be acquired is provided, the positional data whose edge is detected is stored in the registers, and a recovery clock is output with a frequency timing of an internal clock based on this positional data. As a result, an edge timing of a system clock of the device under test can be output with a predetermined frequency, and a recovery clock according to a data rate of output data from the device under test can be output.

Furthermore, by outputting the recovery clock based on the positional data of the system clock whose edge is detected in this manner, the recovery clock indicative of a correct timing reflecting the edge timing of the actual system clock can be output even when an average value of the acquired positional data is obtained and output as the recovery clock, thereby conducting the further accurate and reliable semiconductor test.

Moreover, the registers of the digital filter are configured to output the positional data stored therein with a predetermined timing irrespective of presence/absence of the edge of the positional data detected by the edge detection circuit.

According to the semiconductor test apparatus of the present invention having the above-described structure, when the edge indicative of a signal change point of the positional data of the clock acquired by the first time interpolator is not detected, positional data of a clock in a previous cycle stored in the registers can be output with a predetermined timing, and the recovery clock can be output based on this positional data in the previous cycle.

Out of the positional data of the clock output from the first time interpolator, only the positional data whose edge is detected can be stored in the registers and used as a reference of the recovery clock. However, when the edge of the positional data is not detected due to an influence of, e.g., jitters, a quantity of positional data to be acquired is small or a cycle in which positional data can be acquired cannot be set fixed in some cases. Therefore, when obtaining an average value of a plurality of sets of positional data and outputting the recovery clock, many registers must be provided in order to output the accurate recovery clock. Thus, in the present invention, when the edge of the positional data to be acquired is not detected, the positional data which has been already stored in a previous cycle and whose edge is detected is output from the registers, and the recovery clock can be output based on this positional data.

Therefore, when obtaining an average value of a plurality of sets of positional data and outputting the recovery clock, many registers must be provided in order to output the accurate recovery clock. Thus, in the present invention, when the edge of the positional data to be acquired is not detected, the positional data which has been already stored in a previous cycle and whose edge is detected is output from the registers, and the recovery clock can be output based on this positional data.

As a result, a positional data acquisition cycle can be set fixed while reflecting an edge timing of the actually acquired positional data, the number of registers to be set can be optimized, and the reliable semiconductor test apparatus with a simple structure can be realized without complication, increase in size, increase in cost and others of the test structure.

Incidentally, when the edge of the positional data of the clock of the first time interpolator cannot be detected, it is possible to change over whether the positional data in a previous cycle stored in the registers is output as a reference of the recovery clock. As a result, for example, only by using the actual edge timing of the clock of the device under test, the positional data can be selectively adopted in accordance with a test content or the like. For example, the only positional data whose edge is detected is selected when performing a further accurate function test, a jitter analysis or the like, and the positional data in a previous cycle which has been already stored is also used when performing a logic test which checks the output data or the clock data of the device under test based on an average value in a fixed cycle.

Moreover, when two or more registers are provided, the digital filter comprises an average value calculation circuit which receives positional data output from each of the two or more registers, calculates an average value of edge timings indicated by respective sets of positional data, and outputs the average value as the recovery clock.

According to the semiconductor test apparatus of the present invention having such a structure, by providing the plurality of registers and the average value calculation circuit which receives positional data of each register to the digital filter, the positional data output from the time.

interpolator can be stored in the plurality of registers, an average value of the plurality of sets of positional data can be calculated, and it can be output as the recovery clock. As a result, the average value of the edge timings indicated by the plurality of sets of positional data can be used as the recovery clock according to the present invention, it can be used as a correct and adequate timing signal which reflects the edge timing of the actual system clock of each device under test. Even if the edge of the clock cannot be detected or the edge timing fluctuates due to jitters, the recovery clock accurately indicative of the edge timing of the clock of the device under test can be acquired.

Additionally, the digital filter comprises an average value changeover switch which selects one of the positional data output from one register among the two or more registers and the average value output from the average value calculation circuit, and outputs it as the recovery clock.

According to the semiconductor test apparatus of the present invention having such a structure, by providing the average value changeover switch, the positional data output from a specific register and the average value of the positional data of the plurality of registers can be selectively switched and output as the recover clock output from the digital filter.

As a result, the recovery clock can be selectively used in accordance with a test content or the like. For example, the average value of the plurality of registers is output as the recovery clock when performing a function test taking timing fluctuations due to jitters of the system clock of the device under test into consideration, and the positional data output from one register among the plurality of registers is used as the recovery clock when conducting a logic test which checks the system clock or the output data itself of the device under test irrespective of timing fluctuations due to jitters. Thus, the semiconductor test apparatus superior in the multiusability and the expandability can be realized.

Further, the digital filter comprises a timing correction circuit which adds a predetermined correction value to the positional data output from the registers, corrects the edge timing indicative of the positional data, and outputs a result as the recovery clock.

According to the semiconductor test apparatus of the present invention having such a structure, by providing the timing correction circuit, a set value (correction value) taking a setup time, a hold time or the like into consideration can be added to the positional data output from one register or the average value of the positional data output from the two or more registers, and the recovery clock corrected to have an adequate edge timing can be output.

In general, in order to stably acquire the output data by using the clock signal, a setup time (or a hold time) of the output data with respect to the clock must be taken into consideration. Thus, in the present invention, by providing the timing correction circuit which adds a set value of the setup time or the hold time to the positional data output from the registers of the digital filter, it is possible to output the recovery clock corrected to have an adequate edge time while taking the setup time or the hold time of the output data into consideration. As a result, time-series level data output from the time interpolators can be acquired by using the recover clock corrected to have a further adequate timing, thereby providing a further accurate and reliable semiconductor test apparatus.

Furthermore, the semiconductor test apparatus according to the present invention comprises a jitter detection circuit which receives a plurality of recovery clocks output from the digital filter, detects a phase difference between edge timings indicated by the respective recovery clocks and obtains a jitter of the clock of the device under test.

According to the semiconductor test apparatus of the present invention having such a structure, by providing the jitter detection circuit which receives the plurality of recovery clocks, a phase difference between the recovery clocks can be detected by applying subtraction processing to the positional data indicative of the edge timings of the respective recovery clocks. Moreover, distribution of this phase difference can be obtained, and it can be output as distribution data showing irregularities or spread of the phase differences. The phase difference between the recovery clocks represents a jitter of the system clock of the device under test, and it is possible to perform jitter analysis of the clock and the output data of the device under test by obtaining the phase difference between the recovery clocks and its distribution data.

As a result, in the present invention, the accurate jitter analysis of the output data and the clock of the device under test can be readily, correctly and assuredly carried out without generating a problem which can be observed when using an existing jitter measuring instrument-or the like, e.g., errors due to an operation of an oscilloscope or the like, difficulties in an measurement operation and others.

Additionally, the semiconductor test apparatus according to the present invention comprises a bus which connects the first and second time interpolators with each other, and distributes data output from the first and second time interpolators to a predetermined data selection circuit.

By adopting such a structure, in the semiconductor test apparatus according to the present invention, time-series level data output from each of the first and second time interpolators can be separately input to the data selection circuit through the bus, a desired clock can be allocated to desired output data and input to the data selection circuit, thereby acquiring measurement data. As a result, even when the plurality of first and second time interpolators and data selection circuits are provided in accordance with the device under test, each clock and output data can be arbitrarily combined and measurement data can be fetched, thereby realizing an LSI tester with the higher multiusability and convenience.

BRIEF DESCRIPTION OF THE DRAWINGS

FIGS. 5(a) and 5(b) are signal diagrams in case of acquiring output data with an edge timing of a system clock when a mode changeover switch of a digital filter is changed over to Direct Edge, in which FIG. 5(a) shows an example of acquiring data at a rise edge of an edge timing of a clock, and FIG. 5(b) shows an example of acquiring data at both of a rise edge and a fall edge of the same;

BEST MODE FOR CARRYING OUT THE INVENTION

Preferred embodiments of a semiconductor test apparatus according to the present invention will now be described hereinafter with reference to the accompanying drawings.

FIRST EMBODIMENT

A first embodiment of a semiconductor test apparatus according to the present invention will now be described with reference to FIGS. 1 to 6.

Figure 1:
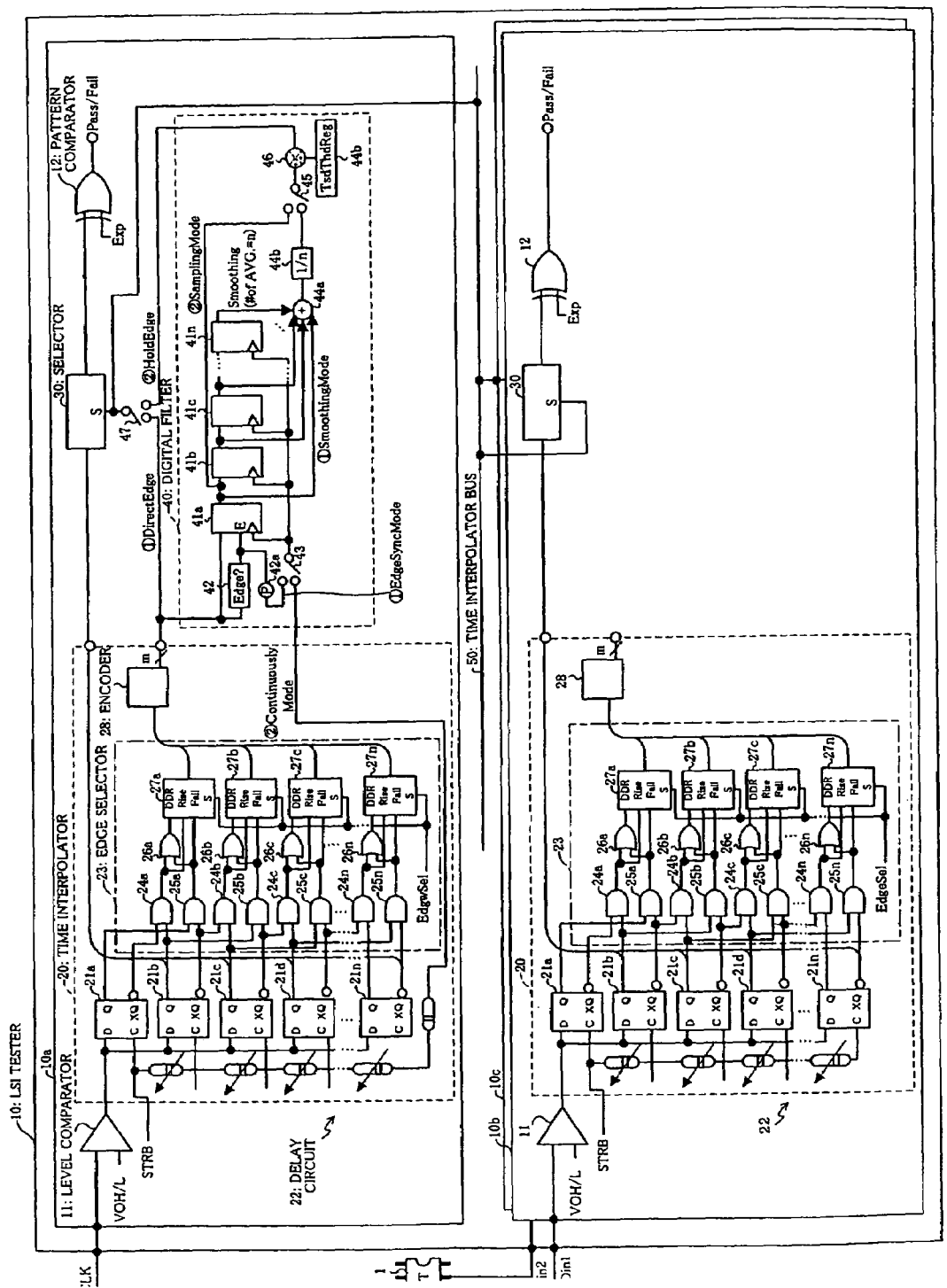
FIG. 1 is a block diagram showing a structure of a semiconductor test apparatus according to a first embodiment of the present invention.

FIG. 1 is a block diagram showing a structure of a semiconductor test apparatus according to the first embodiment of the present invention. As shown in the drawing, the semiconductor test apparatus according to this embodiment comprises an LSI tester 10 which conducts a function test of a device under test (DUT). The LSI tester 10 acquires output data output from the device under test 1 as measurement data, and judges the acceptability of the device under test 1 by comparing the measurement data with predetermined expectation value data.

The device under test 1 outputs predetermined output data upon receiving a signal from a non-illustrated pattern generator or the like, and outputs a clock signal (system clock).

As the LSI which outputs clocks therefrom in this manner, for example, there is the above-described LSI which uses "RapidIO" (registered trademark) or "HyperTransport" (registered trademark), a bridge LSI which is used to convert a bus system from a PCI bus into "RapidIO" or the like, and the test apparatus according to this embodiment can perform a test of such a device.

Figure 9:
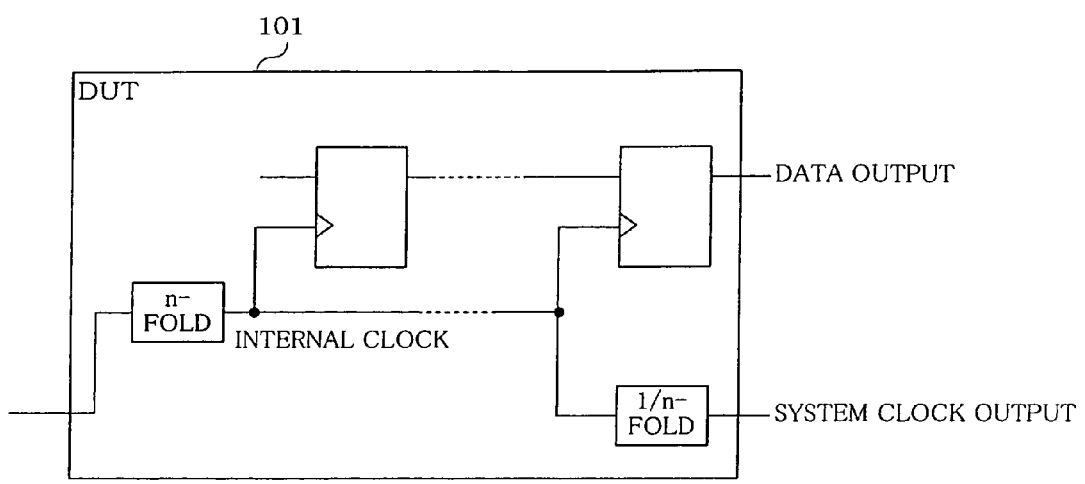
FIG. 9 is a block diagram showing a schematic structure of a semiconductor device which outputs data at a date rate of an internal clock faster than a system clock.

Further, like the device shown in FIG. 9, the device under test 1 according to this embodiment constitutes a device which generates an internal clock having a frequency which is n-fold of that of a system clock by using a PLL circuit or the like and outputs data with a timing of the internal clock faster than the system clock.

As this type of device, there is, e.g., an ODR type device. The ODR type device generates an internal clock which is quadruple of a system clock and outputs data in synchronization with both a rise edge and a fall edge of this internal clock (DDR: Double Data Rate), thereby realizing data output at a data rate which is eightfold of that of the system clock. In the semiconductor-test apparatus according to this embodiment, an accurate test can be conducted with respect to such an ODR type device.

The LSI tester 10 fetches a recovery clock indicative of an adequate edge timing with a desired frequency from a system clock of the device under test 1 by inputting the system clock and output data output from the device under test 1 to each channel (each source synchronous circuit), and acquires output data with a timing indicated by the recovery clock, thereby outputting it as measurement data.

Specifically, as shown in FIG. 1, the LSI tester 10 comprises a clock side source synchronous circuit (clock recovery circuit) 10a which receives a clock signal output from the device under test 1, and also comprises data side source synchronous circuits 10b, 10c . . . 10n (not shown) which receive output data output from the device under test 1.

The respective source synchronous circuits 10a, 10b, 10c . . . have the same structure except that a digital filter 40 is provided on the clock side, and can acquire a clock or output data output from the device under test 1 by using a plurality of strobes having specified timing intervals, output it as time-series level data, and select and obtain output data with an edge timing of the clock of the device under test 1 by using the time-series level data.

Each of the source synchronous circuits 10a, 10b, 10c . . . processes each clock and output data output from the device under test 1 per pin, and circuits-having substantially the same structures are allocated to these circuits one by one.

In this embodiment, as shown in FIG. 1, one source synchronous circuit 10a is provided on the clock side of the device under test 1, and 1 to n source synchronous circuits 10b, 10c . . . are provided on the output data side of the device under test 1. The clock side source synchronous circuit 10a constitutes a clock recovery circuit including a digital filter 40 as different from the data side source synchronous circuits 10b, 10c . . . .

Furthermore, the respective source synchronous circuits 10a, 10b, 10c . . . are connected with each other through a time interpolator bus 50, and signals are input/output between predetermined channels (source synchronous circuits) under the control of the time interpolator bus 50 as will be described later.

The respective source synchronous circuits on both the clock side and the output side have substantially the same structures as shown in FIG. 1. Specifically, each circuit comprises a level comparator 11, and a pattern comparator 12 as well as a time interpolator 20 and a digital filter 40.

The level comparator 11 receives an output signal (clock or output data) from the device under test 1, compares it with a predetermined comparison voltage in level, and outputs a signal to the time interpolator 20 like the conventional LSI tester.

The pattern comparator 12 compares the output data of the device under test 1 selected by a selector 30 through the time interpolator 20 and the digital filter 40 with a predetermined expectation value, and outputs a test result.

The time interpolator 20 acquires a clock or output data output from the device under test 1 by using a plurality of strobes having specified timing intervals, and outputs it as time-series level data.

Specifically, the time interpolator 20 comprises flip-flops 21a to 21n as a plurality of sequence circuits, a delay circuit 22, an edge selector 23 and an encoder 28.

The plurality of flip-flops 21a to 21n are composed of D type flip-flop groups connected with each other in-parallel in this embodiment, and each flip-flop receives an output signal (clock or output data) output from the device under test through the level comparator 11 as input data. Moreover, each flip-flop outputs the received data with a predetermined timing by using the strobe input through the delay circuit 22 as a clock signal.

It is to be noted that the first flip-flop 21a in the plurality of flip-flops 21a to 21n is used for an initial value, and output data of the second and subsequent flip-flops 21b to 21n is input to the later-described selector 30.

Here, the plurality of sequence circuits included in each time interpolator 20 can be constituted of sequence circuits other than the flip-flops 21a to 21n in this embodiment, e.g., latches.

The same advantage as that of this embodiment can be demonstrated by providing the latches as the sequence circuits in the time interpolator 20.

Additionally, as the sequence circuits included in the time interpolator 20, it is possible to adopt any circuit configuration besides the flip-flops 21a to 21n, the latches and others as long as the clock and the output data from the device under test 1 can be acquired at specified timing intervals and they can be output as the time-series level data.

The delay circuit 22 sequentially inputs the strobes delayed at specified timing intervals to clock terminals of the plurality of flip-flops 21a to 21n, and outputs the time-series level data from the flip-flops 21a to 21n.

Here, the number of the plurality of flip-flops 21a to 21n and a delay quantity of the delay circuit 22 can be arbitrarily set and changed, and a bit width (number of the sequence circuits) or a resolution (delay quantity of the delay circuit) of the time-series level data acquired by the time interpolator 20 can be set to desired values.

As a result, the time-series level data to be acquired can be set in many ways in accordance with a data rate or a jitter width of the device under test 1 as a test target, thereby coping with any LSI.

Further, the strobes input to the flip-flops 21a to 21n can be set to an arbitrary timing and frequency, and different input timings or delay quantities can be set depending on the clock side and the output data side. In this embodiment, by providing a timing generator or the like in accordance with each of the channels 10a to 10n of the source synchronous circuits, the strobes can be independently input depending on the clock side and the output data side (see STRB shown in FIG. 1). As a result, it is possible to adjust the strobes to an appropriate timing in accordance with a phase difference of the clock and the output data output from the device under test 1. The clock and the output data output from the device under test 1 do not always necessarily match with each other in phase and, for example, a setup time may be added to or subtracted from one another in some cases. Therefore, in such a case, by changing the timing of the strobes depending on the clock side and the output data side, it is possible to adjust the strobes to be output with an appropriate timing to the clock and the output data having a phase difference.

The edge selector 23 receives the time-series level data output from the flip-flops 21a to 21n, and selectively outputs level data indicative of a rise edge of this level data, level data indicative of a fall edge of the same, or level data indicative of the rise edge and the fall edge of the same.

Specifically, the edge selector 23 in this embodiment comprises a plurality of selector circuit groups each including two AND circuits 24 and 25, one OR circuit 26 and one selector 27 for each of the outputs of the flip-flops 21a to 21n.

As shown in FIG. 1, the first AND circuit 24 (24a to 24n) is an AND circuit which receives a reverse output of one flip flop (e.g., 21a) in the plurality of flip-flops 21a to 21n and a non-reverse output of a flip-flop (e.g., 21b) on the next stage. An output from this first AND circuit 24 is selected as level data for SDR (SDR: Rise Edge mode) indicative of a rise edge of the clock.

As shown in FIG. 1, the second AND circuit 25 (25a to 25n) is an AND circuit which receives a non-reverse output from one flip-flop (e.g., 21a) in the plurality of flip-flops 21a to 21n and a reverse output from a flip-flop on the next stage.

An output from this second AND circuit 25 is selected as level data for SDR (SDR: Fall Edge mode) indicative of a fall edge of the clock.

As shown in FIG. 1, the OR circuit 26 (26a to 26n) is an OR circuit which receives outputs from the first and second AND circuits 24 and 25. An output from this OR circuit 26 is selected as level data for DDR indicative of both of a rise edge and a fall edge of a clock (DDR: Both Edge mode).

As shown in FIG. 1, the selector 27 (27a to 27n) is a selection circuit composed of a multiplexer or the like which receives respective outputs from the first AND circuit 24, the second AND circuit 25 and the OR circuit 26, selects and outputs one of the outputs by switching of an edge select signal.

By providing such an edge selector 23, when the time-series level data acquired by using a plurality of strobes through the flip-flops 21a to 21n is input, one mode of ① an output from the first AND circuit 24 (the rise edge alone; SDR: Rise Edge mode), ② an output from the second AND circuit 25 (the fall edge alone; SDR: Fall Edge mode) and ③ an output from the OR circuit 26 (both of the rise edge and the fall edge; DDR: Both Edge mode) is selected and output by a selection of the selectors 27a to 27n, and an edge timing indicated by the selected level data is encoded by an encoder 28 on a next stage.

It is to be noted that a plurality of selector circuit groups constituting the edge selector 23 are configured to receive outputs from one flip-flop and a flip-flop on a next stage among outputs from the plurality of flip-flops 21a to 21n, and hence the level data selected and output by the selectors 27a to 27n is data which is smaller than level data output from the flip-flops 21a to 21n by one bit. For example, when the five flip-flops 21a to 21e output level data corresponding to five bits, level data selected and output by the edge selector 23 is data consisting of four bits which is output through the four selectors 27a to 27d.

Therefore, the number of the respective circuits included in the edge selector 23, i.e., the first AND circuits 24a to 24n, the second AND circuits 25a to 25n, the OR circuits 26a to 26n and the selectors 27a to 27n is respectively the number smaller than the number of the flip-flops 21a to 21n by one (1 to n−1).

The encoder 28 is configured to receive time-series level data output from the plurality of selectors 27a to 27b of the edge selector 23, encode the level data and output the encoded result. Specifically, data sequentially output from the flip-flops 21a to 21n at fixed intervals are sequentially input to the encoder 28 through the respective selectors 27a to 27n of the edge selector 23, encoding is carried out with a timing at which all sets of data are provided, and its result is output.

As a result, the time-series level data output from the flip-flops 21a to 21n is selected through the edge selector 23, and the selected level data is output as encoded positional data.

In this embodiment, since positional data encoded by the encoder 28 of the source synchronous circuit 10a on the clock side is input to the digital filter 40, a recovery clock indicative of an edge timing of a system clock of the device under test 1 can be acquired.

Further, in the source synchronous circuits 10b, 10c, . . . on the output data side, the time-series level data output from the flip-flops 21a to 21n are directly input to the selector 30 as input data, one set of data in the level data input to this output data side selector 30 is selected by the recovery clock output from the digital filter 40, and the selected one set of data is output as measurement data of the device under test 1.

It is to be noted that, in the source synchronous circuits 10b, 10c . . . on the output data side, the edge selector 23 and the encoder 28 are not used in this embodiment (see FIG. 1). Therefore, in regard to the time interpolator 20 on the output data side, the edge selector 23 and the encoder 28 can be eliminated.

The selector 30 is a data selection circuit which receives the time-series level data output from the plurality of flip-flops 21a to 21n as input data, and receives the recovery clock output from the digital filter 40 or the positional data output from the encoder 28 as a selection signal. Furthermore, with an edge timing indicated by the recovery clock (or the positional data of the encoder 28), i.e., an edge timing of the system clock of the device under test 1, output data of the device under test 1 is selected with a frequency timing of the internal clock faster than the system clock, and it is acquired as measurement data of the device under test 1.

Specifically, the selector 30 is composed of a multiplexer or the like, and respective outputs of the flip-flops 21b to 21n except the flip-flop 21a for an initial value in the plurality of flip-flops are directly connected with the data input side of the selector 30, and a time interpolator bus 50 is connected with a select signal terminal of the same.

Moreover, the time-series level data output from the flip-flops 21b to 21n on the output data side are directly input to the selector 30 on the output side as input data without interposing the edge selector 23 and the encoder 28, and the recovery clock acquired by the digital filter 40 on the clock side or the positional data acquired by the encoder 28 on the clock side is selectively input as a selection signal by a control of the time interpolator bus 50.

As a result, in the selector 30 on the output data side, one set of data in the time-series level data output from the flip-flops 21a to 21n of the output data side time interpolator 20 is selected by a selection signal which is either the recovery clock from the digital filter 40 or the positional data from the encoder 28.

Additionally, the output data of the device under test 1 selected by this selector 30 is output to a pattern comparator 12 and compared with a predetermined expectation value by the pattern comparator 12, and a test result is output.

Switching of the selection signal of this selector 30 is carried out by a changeover switch of the later-described digital filter 40.

On the other hand, the time-series level data output from the flip-flops 21b to 21n on the clock side is directly input to the selector 30 on the clock side as input data without interposing the edge selector 23 and the encoder 28, and the positional data acquired by the encoder 28 on the clock side or the recovery clock acquired by the digital filter 40 on the clock side is selectively input as a selection signal by a control of the mode changeover switch 47 of the above-described digital filter 40.

As a result, in the selector 30 on the clock side, the system clock of the device under test 1 is selected as data, and the clock of the device under test 1 which is acquired as the time-series level data output from the flip-flops 21a to 21n of the clock side time interpolator 20 can be fetched by using the level data indicative of an edge timing which is a signal change point of the clock of this device while using the recovery clock from the digital filter 40 or the positional data from the encoder 28 as a selection signal. Therefore, when an expectation value is set with respect to the clock of the device under test 1, the clock data output through the selector 30 can be compared with the predetermined expectation value by the pattern comparator 12 on the clock side.

Here, as to the respective selectors 30 on the clock side and the output data side, the selection signals to be input can be switched by the control of the time interpolator bus 50, and a desired selector 30 can be used.

Specifically, when the selector 30 on the output data side is used to compare the output data from the device under test 1 with the expectation value, the recovery clock of the digital filter 40 or a signal from the encoder 28 on the clock side is input to the selector 30 on the output side as the selection signal through the time interpolator bus 50. In this case, the selector 30 on the clock side (and the pattern comparator 12) is not used.

On the other hand, when the selector 30 on the clock side is used to compare the clock of the device under test 1 with the expectation value, the recovery clock of the digital filter 40 or the signal from the encoder 28 on the clock side is not input to the selector 30 on the output side by the control of the time interpolator bus 50. In this case, the selector 30 on the output data (and the pattern comparator 12) is not used.

In this manner, the output signal from the time interpolator 20 is selectively input to each selector 30 on the clock side or the output data side in accordance with a test content or the like in this embodiment. As a result, providing the selector 30 to at least one of the source synchronous circuits on the clock side and the output data side can suffice depending on a test content or the like, and one of the selectors 30 on the clock side and the output side can be eliminated.

The digital filter 40 is provided to the source synchronous circuit 10a on the clock side, and it receives and holds positional data of the clock output from the encoder 28 of the time interpolator 20 on the clock side and outputs a recovery clock indicative of a predetermined edge timing from one or more sets of positional data. Specifically, the digital filter 40 comprises a plurality of registers 41 (41a to 41n), an edge detection circuit 42, an edge changeover switch 43, an average value calculation circuit 44, an average value changeover switch 45, a timing correction circuit 46 and a mode changeover switch 47.

As shown in FIG. 1, the plurality of registers 41a to 41n are composed of a predetermined number (1 to n) of register groups connected with each other in series, sequentially store positional data output from the encoder 28 of the time interpolator 20 on the clock side, and output the stored positional data with a predetermined timing. For example, when the encoder 28 outputs positional data composed of three bits, each of the registers 41a to 41n receives and stores the positional data composed of three bits and receives a predetermined trigger signal, thereby outputting the stored three-bit positional data.

More specifically, as to the registers 41a to 41n, the positional data of the encoder 28 is first input and stored to the register 41a on the forefront state, and this positional data is output with a predetermined timing and sequentially input to the registers 41b to 41n on the next stage which are connected with each other in series. The positional data output from the register 41n on the last stage is input to the later-described average value calculation circuit 44.

Additionally, the positional data output from each of the registers 41a to 41n is input to the registers on the next stage and, at the same time, also input to the average value calculation circuit 44. As a result, in the average value calculation circuit 44, an average value of the edge timings indicated by the positional data of the respective registers 41a to 41n is calculated.

Further, the positional data output from the register 41a on the forefront stage is also input to the later-described average value changeover switch 45. As a result, one of the average value of the positional data output from the average value calculation circuit 44 and the positional data output from the register 41a on the forefront stage is selected.

It is to be noted that the number of the registers 41a to 41n according to this embodiment can be arbitrarily set and changed, and the number of sets of the positional data which can be acquired and a resolution of the average value of the positional data can be adjusted in accordance with the number of the registers 41a to 41n.

That is, as to the registers 41a to 41n, providing at least one register 41a which receives the positional data output from the time interpolator can suffice, and the number of the registers can be set to an optimum number in accordance with a data rate, a jitter width or the like of the device under test 1 as a test target.

Furthermore, strobes are input to the registers 41a to 41n with a predetermined timing, and the positional data is output with an arbitrary timing.

The edge detection circuit 42 detects presence/absence of an edge of the positional data input from the encoder 28 of the time interpolator 20. Moreover, when the edge is detected, this circuit stores the positional data from which the edge is detected in the register 41a on the forefront stage, and outputs the positional data which has been already stored in each of the registers 41a to 41n.

A signal change point (the rise edge or the fall edge) is detected from the positional data of the clock acquired by the timer interpolator 20 in a fixed cycle in accordance with a frequency of the clock. Therefore, when the positional data is acquired in each of the registers 41a to 41n by using the strobes faster than the clock cycle, data in which the signal change point (the rise edge or the fall edge) does not exist is also obtained. In such a case, an edge timing is not indicated in the positional data. Therefore, even if such positional data is stored in the registers 41a to 41n, the edge timing of the clock cannot be acquired from this positional data.

Thus, in this embodiment, by providing the edge detection circuit 42 which detects presence/absence of an edge of the positional data acquired by the encoder 28, only positional data from which an edge is detected is sequentially stored and output in the registers 41a to 41n, and the recovery clock is obtained based on this positional data.

Specifically, the edge detection circuit 42 receives the positional data from the encoder 28, and detects presence/absence of an edge in this positional data. Moreover, when an edge of the positional data is detected, an enable signal is output to the register 41a on the forefront stage ("E" shown in FIG. 1), and the register 41a on the forefront stage is change to a data input enabled state. As a result, the positional data from which the edge is detected is stored in the register 41a on the forefront stage. On the other hand, when the edge of the positional data is not detected, the edge detection circuit 42 does not output the enable signal. Therefore, when the edge of the positional data is not detected, the register 41a on the forefront stage is changed to an input disabled state, and the positional data from which the edge is not detected is not stored in the register 41a.

Then, the edge detection circuit 42 further inputs the enable signal to a pulser 42a ("P" shown in FIG. 2), converts it into a trigger signal which is input to each of the registers 41a to 41n, and inputs this trigger signal to each of the registers 41a to 41n, and outputs the positional data-stored in each of the registers 41a to 41n with a predetermined timing.

As a result, out of the positional data acquired by the time interpolator 20, only the positional data from which the edge indicative of a signal change point is detected is stored in the registers 41a to 41n as positional data which can be a reference of the recovery clock, and output. Additionally, when an edge of the positional data is not detected in the current cycle, an edge of the positional data is detected in subsequent cycles, and the positional data stored in each of the registers 41a and 41n is output.

By providing such an edge detection circuit 42, even if the edge of the system clock of the device under test 1 is not detected, the recovery clock can be acquired based on the already stored positional data, and the accurate recovery clock can be stably output even in case of obtaining data with a timing faster than a frequency of the system clock.

Further, by providing the edge detection circuit 42 in this manner and outputting the recovery clock based on the only positional data from which the edge is detected, it is possible to output the recovery clock indicative of the accurate timing reflecting an actual edge timing of the system clock when obtaining an average value of the positional data by the later-described average value calculation circuit 44 and outputting it as the recovery clock.

The edge changeover switch 43 is switching means which is connected with the edge detection circuit 42 and selectively switches between the trigger signal which is input to each of the registers 41a to 41n through the pulser 42a of the edge detection circuit 42 and the strobe which is output from the delay circuit 22 of the time interpolator 20.

When the only positional data from which the edge is detected by the control of the above-described edge detection circuit 42 is stored in the register and it is used as a reference of the recovery clock, the edge of the positional data may not be detected in accordance with a clock frequency in some cases, and a quantity of the positional data to be acquired becomes small. Thus, in this embodiment, the strobe output with a predetermined timing can be input to the registers 41a to 41n by providing the edge changeover switch 43 which can be signal switching means, and the predetermined positional data can be sequentially output and the recovery clock can be acquired irrespective of presence/absence of the edge of the positional data to be acquired.

Figure 2:
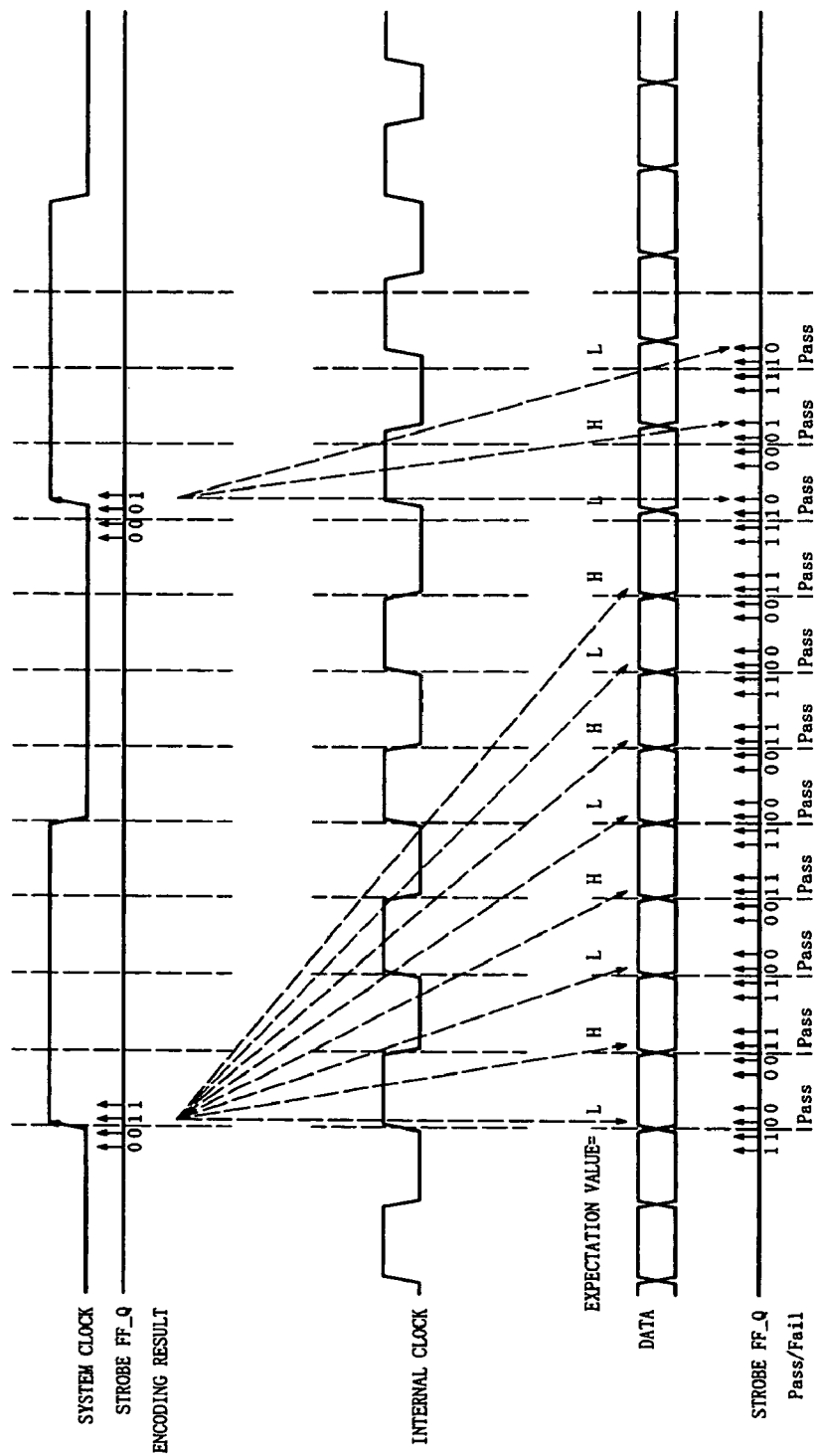
FIG. 2 is a signal diagram showing an operation example of a Hold Edge mode to acquire output data output in accordance with an internal clock with a timing of a recovery clock obtained from a system clock of a device under test.

Specifically, the edge changeover switch 43 switches a mode to input the trigger signal which is output from the pulser 42a of the above-described edge detection circuit 42 as a timing signal (trigger signal) which is used to output the positional data stored in the registers 41a to 41n ((1) Edge Sync Mode shown in FIG. 2), and a mode to input the strobe which is output from the delay circuit 22 of the time interpolator 20 ((2) Continuous Mode shown in FIG. 2).

Furthermore, by switching this edge changeover switch 43 and selecting the strobe of the delay circuit 22 ((2) Continuous Mode), a strobe signal which is output from the delay circuit 22 of the time interpolator 20 with a predetermined timing can be input to the registers 41a to 41n, and the positional data can be output from each of the registers 41a to 41n irrespective of presence/absence of edge detection.

In this (2) Continuous Mode, since the enable signal is not input to the register 41a on the forefront stage, the positional data stored in the register 41a is held as it is, and the positional data which is output from the registers 41a to 41n-1 on the previously stage is stored in the registers 41b to 41n on the next and subsequent stages. Therefore, when the edge of the positional data is detected, the respective registers 41a to 41n sequentially store and output the positional data thereof like the example of the above-described edge detection circuit 42. When the edge of the positional data is not detected, the already stored positional data in the previous cycle is sequentially output and stored in the registers on the next stage. As a result, in this (2) Continuous Mode, the positional data indicative of the edge timing is sequentially output with a timing of the strobe of the delay circuit 22 irrespective of presence/absence of edge detection of the positional data.

As described above, in this embodiment, by providing the edge changeover switch 43, when the edge of the positional data from the time interpolator 20 is not detected, it is possible to select either disabling the output of the positional data from the register 41 which can be a reference of the recovery clock ((1) Edge Sync Mode) or enabling the output of the positional data in the previous cycle stored in the register ((2) Continuous Mode). As a result, it is possible to selectively adopt the positional data in accordance with a test content or the like. For example, the only positional data from which the edge is detected is selected in case of performing a further precise function test or jitter analysis or the like only by using an actual edge timing of the system clock of the device under test ((1) Edge Sync Mode), and the already stored positional data in the previous cycle is also used in case of conducting a logic test which checks output data or clock data of the device under test from an average value with a fixed cycle ((2) Continuous Mode).

The average value calculation circuit 44 receives the positional data which is output from each of the plurality of registers 41a to 41n, calculates an average value of the edge timings indicated by the respective sets of positional data, and outputs this average value as a recovery clock. Specifically, the average value calculation circuit 44 comprises an addition circuit 44a which receives the positional data which is output from the registers 41a to 41n and adds all sets of positional data, and a division circuit 44b which divides an addition result of this addition circuit 44a by the number of registers (n).

By providing such an average value calculation circuit 44, an average value of the plurality of sets of positional data stored in the respective registers 41a to 41n can be calculated, and this average value can be output as the recovery clock. As a result, the recovery clock can be used as an accurate and adequate timing signal which reflects an edge timing of an actual clock of each device under test. Further, even when an edge of the clock cannot be detected or when an edge timing fluctuates due to jitters, the further accurate recovery clock based on the average value can be obtained.

The average value changeover switch 45 selects one of the average value which is output from the average value calculation circuit 44 and the positional data which is output from one of the plurality of registers 41, and outputs the selected value as a recovery clock.

Concretely, in this embodiment, the average value changeover switch 45 is selectively connected with the output side of the average value calculation circuit 44 and the output side of the register 41a on the forefront stage, and can switch outputting the average value of the plurality of sets of positional data (① Smoothing Mode shown in FIG. 2) or outputting positional data which is output from the register 41a on the forefront stage, i.e., positional data obtained in the current test cycle (② Sampling Mode shown in the same drawing).

As a result, the positional data which is output from a specific register (register 41a on the forefront stage in this embodiment) and the average value of the positional data of the plurality of registers can be selectively output as a recovery clock which is output from the digital filter 40, thereby enabling a selective use of the recovery clock depending on a test content or the like. For example, the average value of the plurality of registers is output as the recovery clock (① Smoothing Mode) when conducting a function test taking timing fluctuations due to jitters into consideration with respect to the system clock of the device under test, and the positional data which is output from one register (register 41a on the forefront stage) in the plurality of registers is used as the recovery clock (② Sampling Mode) when conducting a logic test which checks the clock data itself of the device under test irrespective of timing fluctuations due to jitters.

The timing correction circuit 46 adds a predetermined correction value to positional data which is output through the average value changeover switch 45, corrects an edge timing indicated by the positional data, and outputs a result as a recovery clock. Concretely, the timing correction circuit 46 is, as shown in FIG. 1, connected with the output side of the average value changeover switch 45, and adds a predetermined correction value stored in a correction value register (Tsd Thd Reg) 46a to the positional data which is output from the average value changeover switch 45.

The positional data which is output from this timing correction circuit 46 serves as a recovery clock which is finally output from the digital filter 40.

The correction value stored in the correction value register 46a is a set value which is used to set a setup time and a hold time of the output data of the device under test 1. In general, in order to stably obtain the output data by using a clock signal, a setup time and a hold time of the output data with respect to the clock must be taken into consideration. Thus, in this embodiment, the correction value indicative of set values of the setup time and the hold time can be stored in the correction value register 46a, and the set value of the setup time or the hold time can be added to the positional data which is output from one register (register 41a on the forefront stage) or the average value of the positional data of all the registers 41a to 41n by the timing correction circuits 46.

Here, the set value of the setup time or the hold time can be set in accordance with a resolution of level data obtained by the time interpolator 20.

For example, when the clock of the device under test 1 is obtained by using the strobe composed of eight bits, the set value can be set as a value which shifts an edge timing of the positional data by an arbitrary bit number within a range of the eight-bit strobe. Specifically, "0", "+1", "−2" or the like can be set as the set value, and it is possible to correct, e.g., delay the edge timing of the positional data by one bit or advance the same by two bits in the range of, e.g., an eight-bit strobe based on such a set value. As a result, the setup time or the hold time of the output data can be taken into consideration, and the recovery clock corrected to have an adequate edge timing can be output.

The recovery clock output from this timing correction circuit 46 is input to the selector 30 as a selection signal, and the time-series level data output from the time interpolator 20 can be obtained by using the recovery clock corrected to have an adequate timing.

The mode changeover switch 47 is switching means for selecting one of the positional data output from the encoder 28 on the clock side and the recovery clock output from the timing correction circuit 46 of the digital filter 40, and outputting it to the selectors 30 on the clock side and the output data side as a selection signal.

Specifically, in this embodiment, the mode changeover switch 47 can be selectively connected with the output side of the encoder 28 on the clock side and the output side of the timing correction circuit 46 of the digital filter 40, and can switch between obtaining the positional data of the encoder 28 ((1) Direct Edge shown in FIG. 1) and obtaining the recovery clock acquired by the digital filter 40 ((2) Hold Edge shown in the same drawing). By switching this mode changeover switch 47, (1) Direct Edge can be selected in case of a device which outputs output data with a timing of the system clock of the device like a regular SDR type device, and (2) Hold Edge can be selected in case of testing the device which outputs output data at a data rate of an internal clock faster than the system clock of the device like an ODR type device.

It is to be noted that the above-described digital filter 40 is provided only in the source synchronous circuit 10a on the clock side but not in the source synchronous circuits 10b, 10c . . . on the data side in this embodiment. However, the digital filter 40 can be provided in the source synchronous circuits 10b, 10c . . . on the output data side. By doing so, the source synchronous circuits on the clock side and the output data side can have completely the same structure. For example, the plurality of source synchronous circuits which are compatible with per pin can all have the same structure in an LSI tester, a clock or output data of the device under test can be allocated to an arbitrary channel of each source synchronous circuit, an allocation operation can be easily and efficiently performed, and a data pin and a clock pin can be arbitrarily counterchanged and set.

Furthermore, when the digital filter 40 is also provided to the source synchronous circuits 10b, 10c . . . on the output data side, a test can be conducted to a device in which the clock is multiplexed to the output data in a device and the output data is output with an edge timing of the multiplexed clock as typified by, e.g., a SERDES (Serializer and Deserializer) by recovering the multiplexed clock by using the digital filter 40.

The time interpolator bus 50 is a transmission line which connects the source synchronous circuit 10a on the clock side with each of the source synchronous circuits 10b, 10c . . . on the output data side. As shown in FIG. 1, the time interpolator bus 50 according to this embodiment connects a select terminal of the selector 30 of each channel (source synchronous circuit) on the output data side with an output of the timing correction circuit 46 of the digital filter 40 and an output terminal of the encoder 28 on the clock side, and performs a switching control to input one of the recovery clock of the digital filter 40 and the positional data of the clock side encoder 28 as a selection signal to any selector 30 of each channel on the output data side.

Incidentally, although not shown in FIG. 1, the plurality of time interpolator buses 50 which distribute data to the plurality of source synchronous circuits are provided in accordance with the respective source synchronous circuits (respective channels).

Further, information about which one of the recovery clock of the digital filter 40 and the signal of the clock side encoder 28 is input to the selector 30 of any channel as a selection signal is usually given in advance. Therefore, the switch can be set to ON/OFF in advance in accordance with that information before using the test apparatus. Furthermore, as to this ON/OFF control information, the information can be written in a non-illustrated control register or the like.

By providing such a time interpolator bus 50, the recovery clock obtained by the digital filter 40 on the clock side can be input to a desired selector 30 on the output data side as a selection signal. As a result, output data obtained by a desired channel can be acquired as measurement data.

Therefore, even when the plurality of source synchronous circuits including the selectors 30 are provided in accordance with a structure, a data rate, a jitter width and others of the device under test 1, the clock data and the output data can be arbitrarily combined and the measurement data can be fetched. For example, when a plurality of sets of clocks and output data are supplied from the device under test 1, a clock pin and a data pin can be arbitrarily counterchanged like "clock 1 and output data 1" or "clock 2 and output data 2". In this case, the measurement data can be independently obtained, as to the "output data 1" with a timing of the "clock 1" and as to the "output data 2", with a timing of the "clock 2".

It is to be noted that the recovery clock of the digital filter 40 or the positional data of the clock side encoder 28 is directly input as a selection signal to the selector 30 on the clock side through the mode changeover switch 47 without using the time interpolator bus 50. As a result, the signal of the "clock 1" can be obtained as the measurement data with the timing of the "clock 1", for example.

A test operation in the semiconductor test apparatus according to this embodiment having the above structure will now be described.

First, when a predetermined test pattern signal is input to the device under test 1 from a non-illustrated pattern generator provided to the test apparatus, a predetermined clock (system clock) and output data corresponding to the test pattern signal are output from the device under test 1.

The clock and the output data output from the device under test 1 are input to each of the source synchronous circuits 10a, 10b, 10c . . . connected with each output terminal.

The clock and the output data input to each synchronous circuit are input to the level comparator 11, compared with a comparison voltage in level, and then input to each time interpolator 20.

The signal (the clock or the output data) input to each time interpolator 20 is first input to the plurality of flip-flops 21a to 21n connected with each other in parallel. Then, strobes are input at specified timing intervals by the delay circuit 22 to clock terminals of the respective flip-flops 21a to 21n to which the clock or the output data is input. As a result, the input clock or output data is obtained as time-series level data and output from the respective flip-flops 21a to 21n.

Then, in the source synchronous circuit 10a on the clock side, the time-series level data output from the flip-flops 21a to 21n is input to the edge selector 23.

The level data input to the edge selector 23 is input to each of the plurality of selectors 27a to 27n through the first and second AND circuits 24 and 25 and the OR circuit 26, and one signal is selected and output by switching of the edge select signal. The level data output from the selectors 27a to 27n is output as level data indicative of any timing of ① the rise edge alone (output of the first AND circuit 24), ② the fall edge alone (output of the second AND circuit 25) and ③ both the rise edge and the fall edge (output of the OR circuit 26) indicated by the level data.

The level data obtained by this edge selector 23. is input to the encoder 28 and it is encoded.

The level data encoded by the encoder 28 becomes positional data indicative of an edge timing (① the rise edge, ② the fall edge or ③ both the rise edge and the fall edge) of the system clock of the device under test 1. Moreover, this positional data is input to the digital filter 40, and obtained as a recovery clock which is corrected to have an adequate timing.

It is to be noted that the time-series level data output from the flip-flops 21a to 21n is directly input to the selector 30 on the clock side as input data, and clock data is acquired and the acceptability can be judged in the pattern comparator 12 when the clock has an expectation value.

In the digital filter 40, the positional data of the system clock output from the encoder 28 is input to the register 41a on the forefront stage, and sequentially input to the registers 41b to 41n on the next stage.

First, the positional data is input to the edge detection circuit 42, and presence/absence of an edge is detected. At this time, one mode is selected to input an enable signal output from the edge detection circuit 42 (1) Edge Sync Mode shown in FIG. 2) or to input a strobe signal output from the delay circuit 22 of the time interpolator 20 ((2 Continuously Mode shown in the same drawing) by switching the edge changeover switch 43 as a timing signal (trigger signal) which is used to output the positional data stored in the registers 41a to 41n.

When ① Edge Sync Mode is selected, the edge detection circuit 42 receives the positional data from the encoder 28 and detects presence/absence of an edge. When the edge of the positional data is detected, the enable signal is input to the register 41a on the forefront-stage. As a result, the only positional data from which the edge is detected is stored in the register 41a on the forefront stage.

Then, the edge detection circuit 42 converts the enable signal into a trigger signal through the pulser 42a, inputs this trigger signal to each of the registers 41a to 41n, and outputs the positional data stored in each of the registers 41a to 41n.

As a result, out of the positional data obtained by the time interpolator 20, only the positional data from which the edge indicative of a signal change point is detected is sequentially stored in and output from the registers 41a to 41n as positional data which can be a reference of the recovery clock. When the edge of the positional data is not detected, in the current cycle, the positional data that has been stored in each of the registers 41a to 41n is output by detection of the edge of the positional data in subsequent cycles.

On the other hand, when ((2) Continuous Mode is selected, the strobe signal is input to the registers 41a to 41n from the delay circuit 22 of the time interpolator 20 irrespective of presence/absence of edge detection in the edge detection circuit 42.

Then, each of the registers 41a to 41n, when the edge of the positional data of the system clock is detected, this positional data is sequentially stored and output like the case in the edge detection circuit 42 mentioned above. When the edge of the positional data is not detected, the already stored positional data in a previous cycle is output and stored in the registers on the next stage.

As a result, in ((2) Continuous Mode, the positional data indicative of the edge timing is continuously output with a timing of the strobes of the delay circuit 22 irrespective of presence/absence of edge detection of the positional data, stored in each of the registers 41a to 41n, and output.

The positional data output from the registers 41a to 41n is input to the average value calculation circuit 44, and an average value of the edge timings indicated by respective sets of positional data is calculated.

Subsequently, outputting the average value output from the average value calculation circuit 44 ((1) Smoothing Mode) or outputting the positional data output from the register 41a on the forefront stage as it is ((2) Sampling Mode) is switched by switching the average value changeover switch 45, and thus either one of the positional data is output to the timing correction circuit 46.

The timing correction circuit 46 adds a set value (correction value) of a setup time or a hold time stored in the correction value register 46a, and outputs the positional data as a recovery clock corrected to have an adequate edge timing.

Then, the recovery cock output from this timing correction circuit 46 is supplied to a predetermined source synchronous circuit on the output side through the mode changeover switch 47 and the time interpolator bus 50, and input to a corresponding selector 30 on the output data side as a selection signal.

First, when ① Direct Edge is selected by switching of the mode changeover switch 47, the positional data output from the encoder 28 on the clock side is input as the selection signal of the selector 30 on the output data side through the time interpolator bus 50. As a result, in the selector 30 on the output data side, output data of the device is selected with an edge timing of the system clock output from the device under test 1.

On the output data side, the time-series level data obtained by the flip-flops 21a to 21n is directly input to the selector 30 as input data except the data of the flip-flop 21a for an initial value. In the selector 30 on the output data side, timing data from the encoder 28 on the clock side is used as a selection signal, and one set of data is selected from the time-series level data indicative of the output data, and this data is output as measurement data.

As a result, in this mode (③ Direct Edge), it is possible to conduct a test of an SDR type device which outputs output data with a timing of the system clock of the device.

On the other hand, when ② Hold Edge is selected by switching of the mode changeover switch 47, the recovery clock output from the digital filter 40 on the clock side is input as a selection signal of the selector 30 on the output data side through the time interpolator bus 50. As a result, in the selector 30 on the output side, the recovery clock obtained by the digital filter 40 is used as a selection signal, and the output data of the device under test 1 is selected with an edge timing indicated by the recovery clock.

Therefore, in case of this mode (② Hold Edge), it is possible to test a device from which the output data is output at a data rate of an internal clock faster than that of a system clock of the device like an ODR type device.

The output data selected and output by the selector 30 on the output data side is input to the pattern comparator 12 and compared with predetermined expectation value data output from the pattern generator in the tester, and a comparison result is output.

Then, based on this comparison result, matching or mismatching between the output data and the expectation value is detected, and the acceptability (Pass/Fail) of the device under test 1 is judged. That is, Pass is determined when the output of the selector 30 matches with the expectation value, and Fail is determined when they do not match with each other.

Likewise, in the selector 30 on the clock side, the time-series level data of the clock obtained by the flip-flops 21a to 21n is directly input to the selector 30 on the clock side as input data except data of the flip-flop 21a for an initial value. In the selector 30 on the clock side, therefore, positional data (① Direct Edge) from the encoder 28 on the clock side or the recovery clock (② Hold Edge) from the digital filter 40 is used as a selection signal, one set of data is selected from the time-series level data indicative of the system clock, and this data is output as measurement data of the clock.

As a result, by inputting the data output from the selector 30 on the clock side to the pattern comparator 12, the system clock of the device under test 1 can be compared with predetermined expectation value data, matching or mismatching between the clock data and an expectation value can be detected based on a result of comparison with the expectation value, and the acceptability (Pass/Fail) of the device under test 1 can be judged only by using the clock signal.

EMBODIMENTS

Concrete embodiments will now be described hereinafter with reference to FIGS. 2 to 6.

[Basic Operation in Hold Edge Mode]

First, a description will be given as to a basic operation when obtaining output data of the device under test 1 by using a recovery clock acquired by the digital filter 40 in the semiconductor test apparatus according to this embodiment with reference to FIG. 2. FIG. 2 is a signal diagram showing an operation example of the Hold Edge mode to obtain output data which is output in accordance with an internal clock with a timing of a recovery clock obtained from a system clock of the device under test 1.

In the example shown in FIG. 2, the device under test 1 is an ODR type device from which data is output in synchronization with both a rise edge and a fall edge of the internal clock having a frequency which is fourfold of that of the system clock, and output data is output at a data rate which is eightfold of that of the system clock. Therefore, in the test apparatus according to this embodiment, this is an example performing a test in the Hold Edge mode using the recovery clock.

In the time interpolator 20 of each source synchronous circuit, the system clock and the output data output from the device under test 1 are obtained as level data in which the number of bits is "4" with a frequency timing of the internal clock of the device under test 1. Moreover, SDR: Rise Edge is selected in the edge selector 23 of the time interpolator 20, the edge changeover switch 43 is set to ((1) Continuous Mode, the average value changeover switch 46 is set to ((1) Smoothing Mode, and the mode changeover switch 47 is set to ((2) Hold Edge (see FIG. 1) in the digital filter 40.

As shown in FIG. 2, as to the system clock output from the device under test 1, a rise edge of the clock is only obtained with a four-bit strobe by the flip-flops 21a to 21n on the clock side (SDR: Rise Edge).

The example in this drawing shows a case in which the edge timing with which the system clock is changed from "L" to "H" is obtained based on a position of a third bit in the four-bit strobe.

This system clock is first input to the flip-flops 21a to 21n, and level data of, e.g., "0011" ("H" from a position of the bit number "3") is acquired. Then, this level data is selected through the edge selector 23, and encoded to positional data (e.g., "10") indicative of the bit number "3" by the encoder 28. As a result, timing data output from the time interpolator 20 becomes positional data "10" indicative of, e.g., the bit number "3".

This positional data is sequentially input to the registers 41a to 41n of the digital filter 40.

In the digital filter 40, ((2) Continuous Mode is selected by the edge changeover switch 43. When an edge of positional data is detected, this positional data is output. When an edge is not detected, positional data in a previous cycle is output. The positional data (e.g., "10") indicative of the bit number "3" is sequentially stored in and output from the registers 41a to 41n starting from the register 41a on the forefront stage.

Further, in the digital filter 40, the average value changeover switch 46 selects the Smoothing Mode, an average value of n sets of positional data output from the n registers is calculated, and "10" indicative of the average value bit number "3" is output.

A set value of a setup time is added to this average value by the timing correction circuit 46. The example shown in FIG. 2 corresponds to a case in which the setup time "0" is added and the positional data after correction becomes, e.g., "10".

Then, this positional data is output as a recovery clock and input to each selector 30 on the output data side through the time interpolator bus 50.

In the selector 30 on the output data, output data of the device under test 1 which is obtained by the flip-flops 21a to 21n of the time interpolator 20 is first directly input to each input terminal. At the same time, the recovery clock is input as a selection signal from the digital filter 40 to each selector 30 on the output data side.

As a result, in the selector 30 on the output data side, data of the input terminal corresponding to "10" (bit number "3") indicated by the recovery clock is selected (struck out) with the cycle of the internal clock while using the recovery clock as a selection signal as shown in FIG. 2, and the retrieved data "H" or "L" is thereby output from the selector 30.

Then, the data output from this selector 30 is compared with a predetermined expectation value by the pattern comparator 12, and its result (Pass/Fail shown in FIG. 2) is stored in a non-illustrated fail analysis memory.

[Hold Edge Mode]

Figure 3:
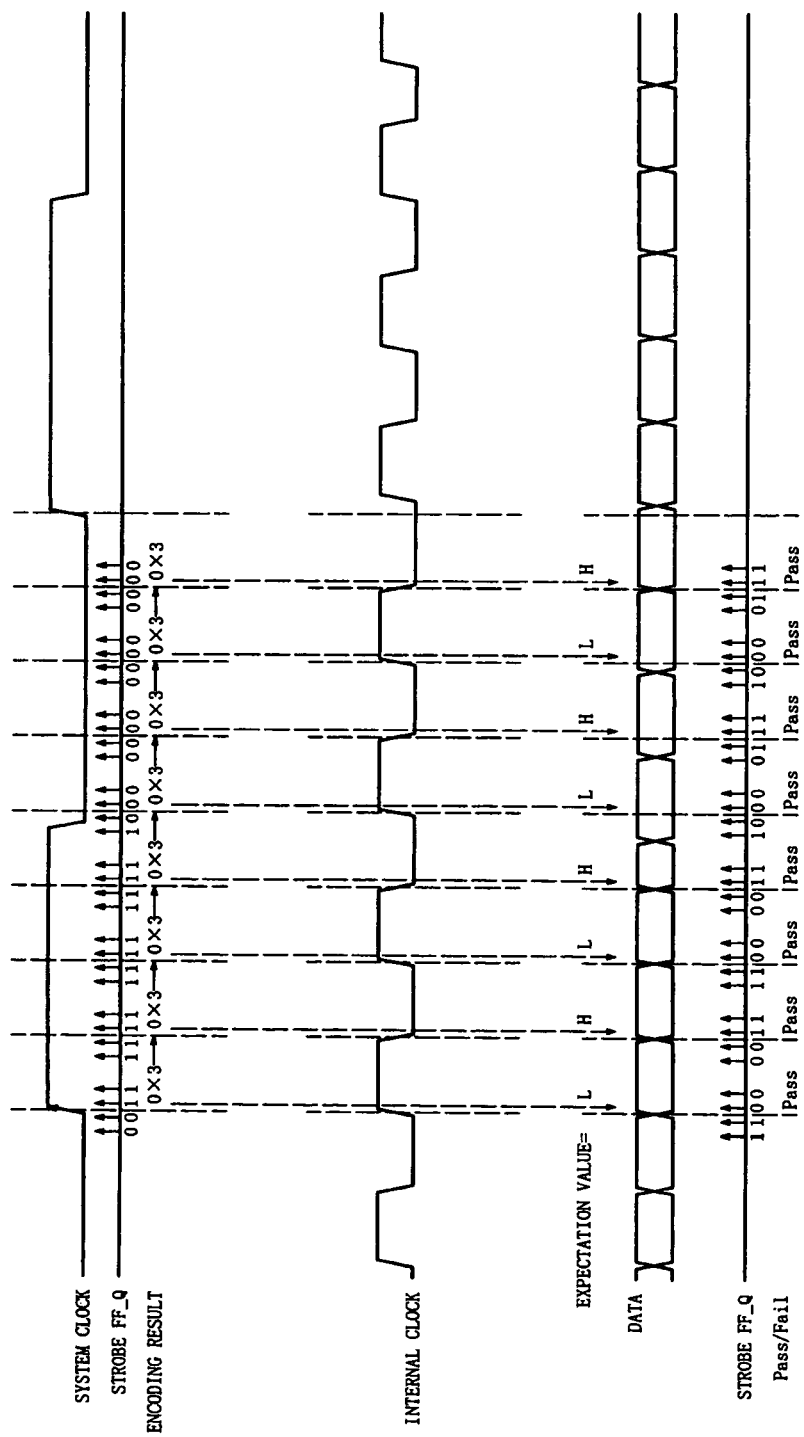
FIG. 3 is a signal diagram of an operation example of the Hold Edge mode, showing an example in which SDR: Rise Edge is selected as a mode of an edge selector.
Figure 4:
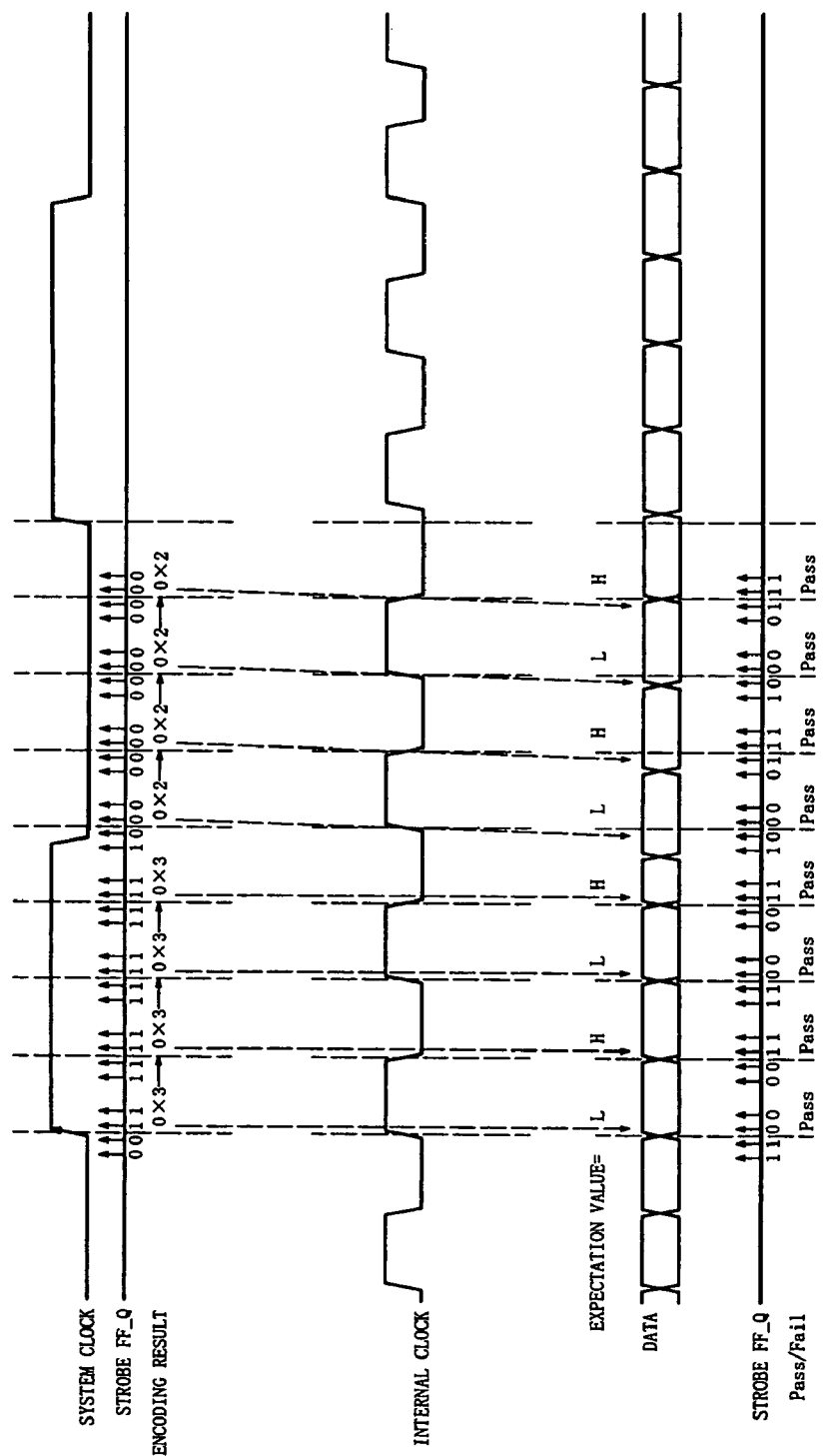
FIG. 4 is a signal diagram of an operation example of the Hold Edge mode, showing an example in which DDR: Both Edge is selected as a mode of the edge selector.
Figure 5:
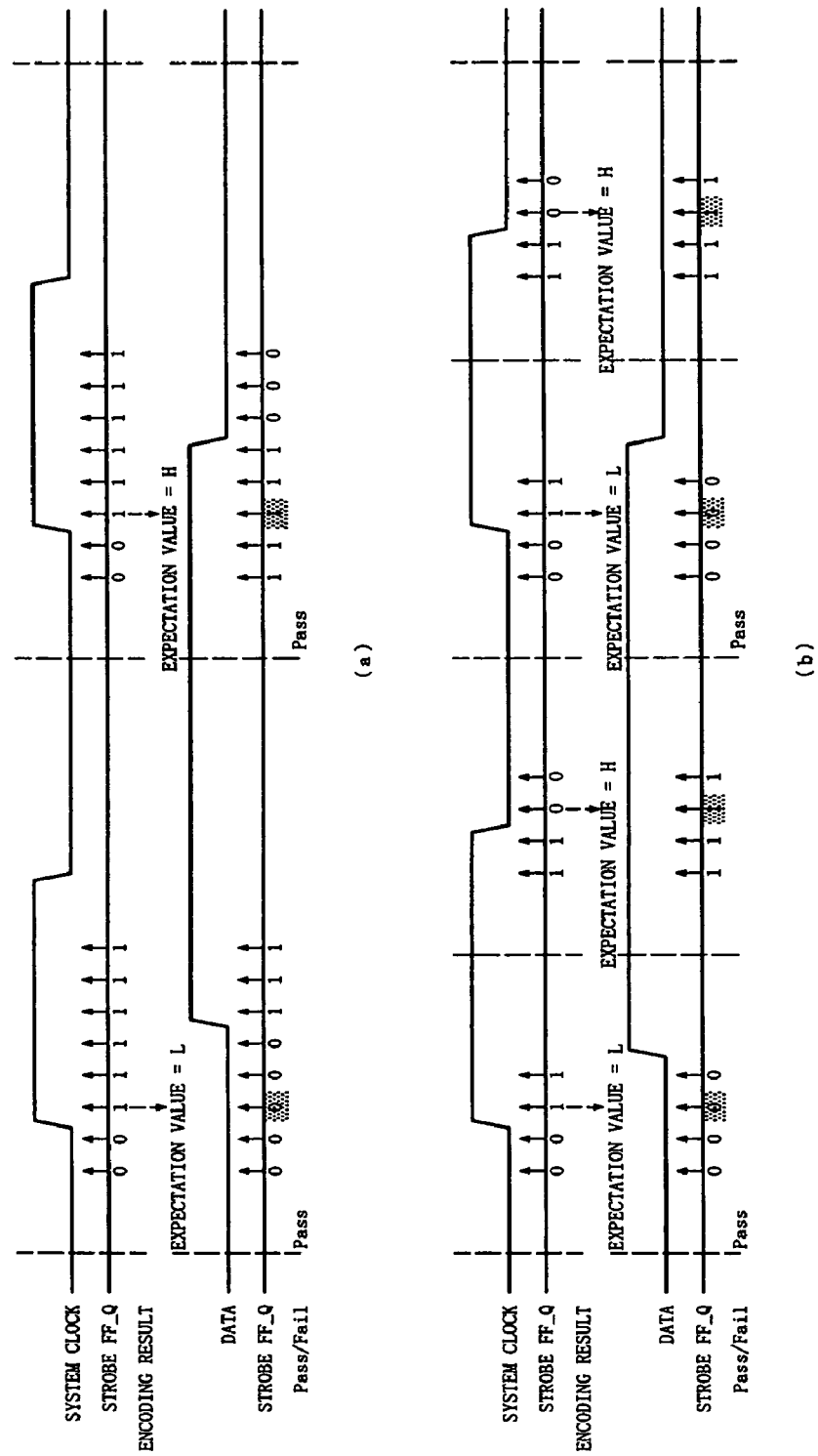
Figure 6:
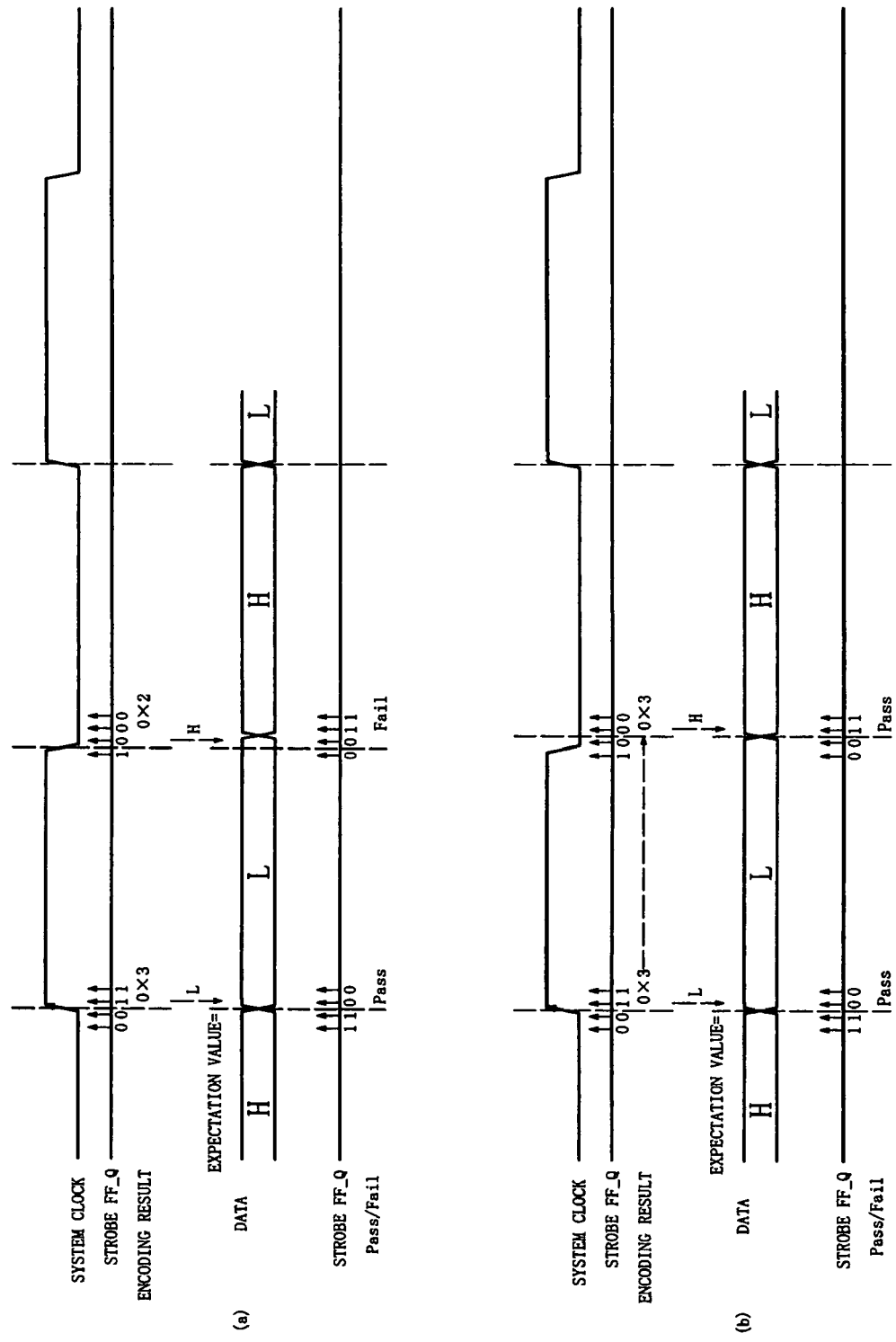
FIGS. 6(a) and 6(b) are signal diagrams showing an example of acquiring a recovery clock with rise and fall edge timings of a system clock in the digital filter by changing a mode of the edge selector to SDR: Rise Edge.

A description will now be given as to an embodiment when switching the edge selector 23 on the clock side in the Hold Edge mode shown in FIG. 2 with reference to FIGS. 3 and 4. FIGS. 3 and 4 are signal diagrams showing operation examples of the Hold Edge mode like FIG. 2, in which FIG. 3 shows a case when SDR: Rise Edge is selected as a mode of the edge selector 23 and FIG. 4 shows a case when DDR: Both Edge is selected. It is to be noted that output data is acquired with a strobe having the bit number "4" in the examples of FIGS. 3 and 4 like the basic operation depicted in FIG. 2, but the bit number of the strobe can be arbitrarily changed.

First, as shown in FIG. 3, when the selection signal of the selectors 27a to 27n of the edge selector 23 is switched and an output of the first AND circuit 24 is selected (SDR: Rise Edge), positional data having an only timing of a rise edge of the system clock of the device under test 1 is acquired. In the example shown in FIG. 3, the edge timing with which "L" of the clock is changed to "H" is acquired at a position of a "third bit" in the four-bit strobe in a first cycle of the system clock.

Furthermore, positional data indicative of this "third bit" is stored in the digital filter 40 and output with a frequency timing of the internal clock, and this positional data is input to each selector 30 on the output data side as a recovery clock.

When SDR: Rise Edge is selected by the edge selector 23 in this manner, the output data is obtained only with a rise edge timing of the system clock. It is to be noted that acquiring positional data with an only fall edge of the system clock (SDR: Fall Edge) is the same as obtaining positional data with an only rise edge.

Then, as shown in FIG. 4, when the selection signal of the selectors 27a to 27n of the edge selector 23 is switched and an output of the OR circuit 26 is selected (DDR: Both Edge), positional data with timings of both a rise edge and a fall edge of the system clock of the device under test 1 is obtained. In the example shown in FIG. 4, an edge timing with which the clock is changed from "L" to "H" is obtained at a position of the "third bit" in the four-bit strobe and an edge timing with which the clock is changed from "H" to "L" is acquired at a position of the "second bit" in the four-bit strobe in the first cycle of the system clock.

Then, the positional data (e.g., "10") indicative of the "third bit" of the rise edge and the positional data (e.g., "01") indicative of the "second bit" of the fall edge are sequentially stored in the digital filter 40, and output with the frequency timing of the internal clock. Subsequently, this positional data is input to each selector 30 on the output data side as a recovery clock.

In this DDR: Both Edge, as to the output data of the device under test 1, as shown in FIG. 4, the output data is acquired with the rise and fall edge timings of the "third bit" in the first and second cycles of the internal clock, and the output data is obtained with the rise and fall edge timings of the "second bit" in the third and fourth cycles. Therefore, in this case, as compared with the example of SDR: Rise Edge (or Fall Edge) shown in FIG. 3, data acquisition with the further improved tracking performance is enabled.

[Direct Edge Mode]

A description will now be given as to an embodiment in which the mode changeover switch 47 of the digital filter 40 is switched to Direct Edge in the test apparatus according to this embodiment with reference to FIGS. 5(a) and 5(b). FIGS. 5(a) and 5(b) are signal diagrams in case of obtaining output data with an edge timing of the system clock when the mode changeover switch 47 of the digital filter 40 is switched to Direct Edge, in which FIG. 5(a) shows an example of obtaining data with a rise edge timing of the clock and FIG. 5(b) shows an example of obtaining data with both rise and fall edges.

In the test apparatus according to this embodiment, by switching the mode changeover switch 47 to Direct Edge, positional data obtained by the encoder 28 on the clock side is input to the selector 30 on the output side, and it is possible to conduct a test of a device from which output data is output with a timing synchronized with the system clock of the device like a regular SDR or DDR type device.

First, as shown in FIG. 5(a), when obtaining output data with a timing of the rise edge of the clock with respect to the SDR type device, the selection signal of the selectors 27a to 27n of the edge selector 23 is switched, and an output of the first AND circuit 24 is selected (SDR: Rise Edge). As a result, output data of the device under test 1 is obtained with a timing of the rise edge of the clock of the device under test 1.

In the example shown in FIG. 5(a), the output data is obtained with a timing of a position of a "third bit" in an eight-bit strobe in a first cycle, and the output data is likewise obtained with a timing of the "third bit" in a second cycle.

Incidentally, when obtaining the output data with a timing of the fall edge of the clock with respect to the SDR type device, data acquisition is likewise enabled by switching the selection signal of the selectors 27a to 27n of the edge selector 23 and selecting an output of the second AND circuit 25 (SDR: Fall Edge).

Moreover, when acquiring the output data with edge timings of both the rise edge and the fall edge of the system clock with respect to the DDR type device, the selection signal of the selectors 27a to 27n of the edge selector 23 is switched, and an output of the OR circuit 26 is selected (DDR: Both Edge). As a result, the output data of the device under test 1 is obtained with timings of both the rise edge and the fall edge of the clock of the device under test 1.

In the example shown in FIG. 5(b), the output data is obtained with a timing of a "third bit" in the four-bit strobe in case of the rise edge of the clock and it is also obtained with a timing of a position of the "third bit" of the four-bit strobe with the fall edge in the first cycle.

Likewise, the output data is obtained with a timing of the "third bit" in four bits in case of the rise edge of the clock and it is also obtained with a timing of the position of the "third bit" in case of the fall edge in the second cycle. As a result, the output data of the regular DDR type device can be obtained with the timing of DDR synchronized with the system clock.

It is to be noted that the test can be of course performed to the above-described regular SDR or DDR type device by using the recovery clock obtained by the digital filter 40. By using the recovery clock obtained by the digital filter 40 with respect to the DDR type device, data can be acquired only by using the accurate edge timing in case of testing the device whose accuracy with respect to one of the rise edge and the fall edge of the system clock is low, for example.

For example, as shown in FIG. 6(a), if the accuracy of the fall edge of the system clock is poor, when data is obtained with the timing of this fall edge, a result becomes Fail even though the timing of the data is normal.

Thus, in such a case, the edge selector 23 is switched to SDR: Rise Edge mode, and the recovery clock is obtained with the rise edge timing of the system clock in the digital filter 40. Then, by obtaining the output data with the edge timing of this recovery clock, the output data can be acquired at a data rate of DDR with a timing of the accurate rise edge of the system clock as shown in FIG. 6(b).

As described above, according to the semiconductor test apparatus of this embodiment, first, by providing the time interpolator 20 to each channel of the source synchronous circuit, the clock and the output data output from the device under test 1 can be obtained as the time-series level data. This time-series level data is indicative of an edge timing which is a signal change point of the clock (and the output data) of the device under test 1. Therefore, by inputting the system clock signal output from the device under test 1 to the time interpolator 20 and acquiring the level data and the positional data indicative of its edge timing, this positional data can be used as a timing signal which is utilized to obtain the output data of the device under test 1.

Additionally, in this embodiment in particular, the edge selector 23 is provided to the time interpolator 20 on the clock side, and the time-series level data obtained by the time interpolator 20 can be selectively output as level data indicative of a timing of a rise edge of the clock, or a timing of a fall edge of the same or timings of both the rise edge and the fall edge of the same. As a result, the output data can be fetched with the edge timings of both the rise edge and the fall edge of the clock of the device under test 1, thereby coping with the DDR type device.

Further, in this embodiment, by providing the digital filter 40 to the source synchronous circuit 10a on the clock side, positional data of the clock obtained by the time interpolator 20 can be held and stored, and it can be output as a recovery clock corrected to have a desired timing at a frequency which is several-fold of that of the system clock.

In the time interpolator 20 on the clock side, the level data and the positional data indicative of the edge timing of the clock can be obtained. However, as described above, when the device under test 1 is an ODR type device which outputs data with timings of both the rise edge and the fall edge of the internal clock having a frequency which is fourfold of that of the system clock, the rise edge (or the fall edge) is detected only once in eight times even if the timing of the rise edge (or the fall edge) of the system clock having a ¼ frequency of the internal clock is imput to the synchronous circuit 10a. Furthermore, a signal change point (rise or fall edge) cannot be detected in any other cycle, and the timing edge of the internal clock having a fourfold frequency is thereby obtained only once in eight times. Moreover, the clock signal output from the device under test 1 has jitters, and the edge timing indicated by the positional data of the clock does not show an accurate timing which is adequate as a timing signal used to obtain test data in some cases.

Thus, by inputting and storing in the digital filter 40 the positional data of the system clock of the device under test 1 obtained by the time interpolator 20 on the clock side, it is possible to output the recovery clock which is a clock signal indicative of an edge timing corresponding to the internal clock having a frequency which is n-fold of that of the system clock and corrected to have an accurate and adequate timing.

Additionally, by providing the selector (data selection circuit) 30 which selects output data of the device under test 1 by using this recovery clock as a selection signal, the time-series level data of the output data obtained by the time interpolator 20 can be selected and output as measurement data which is compared with predetermined expectation value data.

As a result, even when the output data output from the device under test 1 is output based on the internal clock faster than the system clock output from this device, and even when the system clock fluctuates due to jitters, the recovery clock with a desired frequency which is indicative of an adequate edge timing can be output.

As described above, according to the semiconductor test apparatus of this embodiment, a desired recovery clock which is not affected by a frequency or jitters of the system clock of the device under test 1 can be obtained, output data of the device under test 1 can be fetched by using this recovery clock, and an accurate test can be easily and assuredly carried out even in case of a semiconductor device such as an ODR type device whose speed is increased.

SECOND EMBODIMENT

A second embodiment of the semiconductor test apparatus according to the present invention will now be described with reference to FIG. 8.

Figure 8:
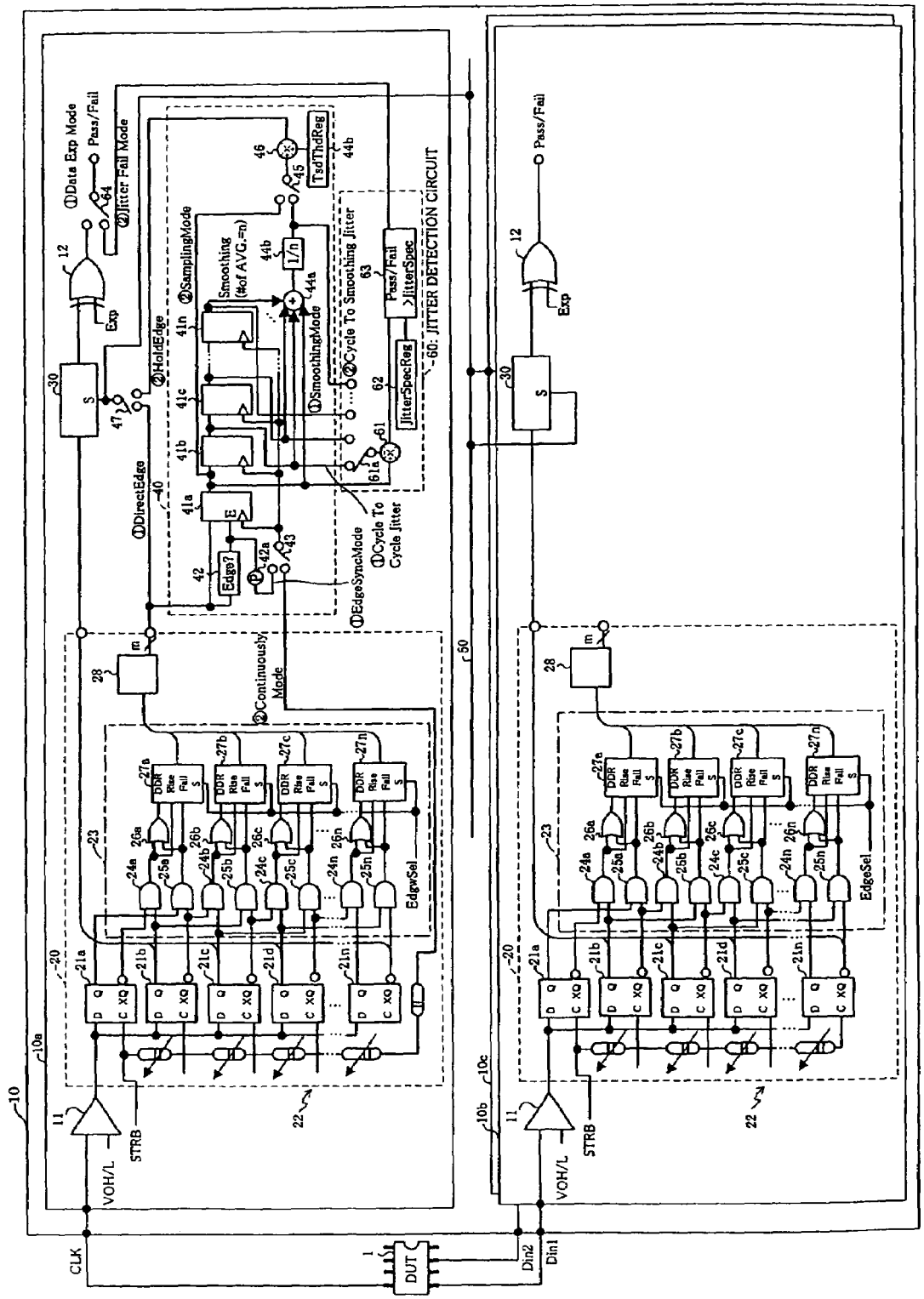
FIG. 8 is a block diagram showing a structure of a semiconductor test apparatus according to a second embodiment of the present invention.

FIG. 8 is a block diagram showing a structure of a semiconductor test apparatus according to the second embodiment of the present invention. As shown in the drawing, the semiconductor test apparatus according to this embodiment is a modified embodiment of the above-described first embodiment, and a jitter detection circuit 60 is further provided to the source synchronous circuit (clock recovery circuit) 10a on the clock side in the first embodiment.

Therefore, any other constituent part is the same as that in the first embodiment, and like reference numerals denote like constituent parts, thereby eliminating the detailed explanation.

The jitter detection circuit 60 receives positional data which can be a reference of the recovery clock output from the registers 41a to 41n of the digital filter 40 and detects a phase difference of edge timings indicated by the positional data, thereby obtaining and analyzing the phase difference as a jitter of a clock (system clock) of the device under test 1. Concretely, the jitter detection circuit 60 comprises a subtraction circuit 61, a jitter limit value register 62 and a comparison judgment circuit 63.

The subtraction circuit 61 receives two sets of positional data which are in contrast with each other from the digital filter 40, and calculates a phase difference of edge timings indicated by the respective sets of positional data.

The positional data (recovery clock) obtained by the digital filter 40 indicates an edge timing of the clock of the device under test 1, and subtracting these sets of positional data from each other can obtain a phase difference of the positional data, i.e., a jitter width of the clock of the device under test 1.

For example, when output data output from the device under test 1 is acquired by a seven-bit strobe, seven types of positional data indicative of its edge timing, e.g., "−3, −2, −1, 0, +1, +2 and +3" are obtained. Therefore, when these sets of positional data are subtracted from each other, 13 types of phase difference data, i.e., "−6, −5, −4, −3, −2, −1, 0, +1, +2, +3, +4, +5 and +6" are obtained. Furthermore, for example, when positional data in which a position of the edge timing is indicative of the bit number "−2" and positional data in which a position of the edge timing is indicative of the bit number "+1" are input to the subtraction circuit 61, applying the subtraction processing to these sets of positional data can obtain the following expression.

"+1"−"−2"="+3"

Therefore, a phase difference of the positional data being "+3" is calculated.

A phase difference calculated by the subtraction circuit 61 in this manner is indicative of a jitter width of the output data of the device under test 1, and is obtaining this phase difference enables jitter analysis of the device under test 1.

Here, in this embodiment, the subtraction circuit 61 is connected with the output side of the register 41a on the forefront-side of the digital filter 40, and also selectively connected with one of the registers 41b to 41n on the next stage and the output side of the average value calculation circuit 44 through a jitter selector 61a.

Figure 7:
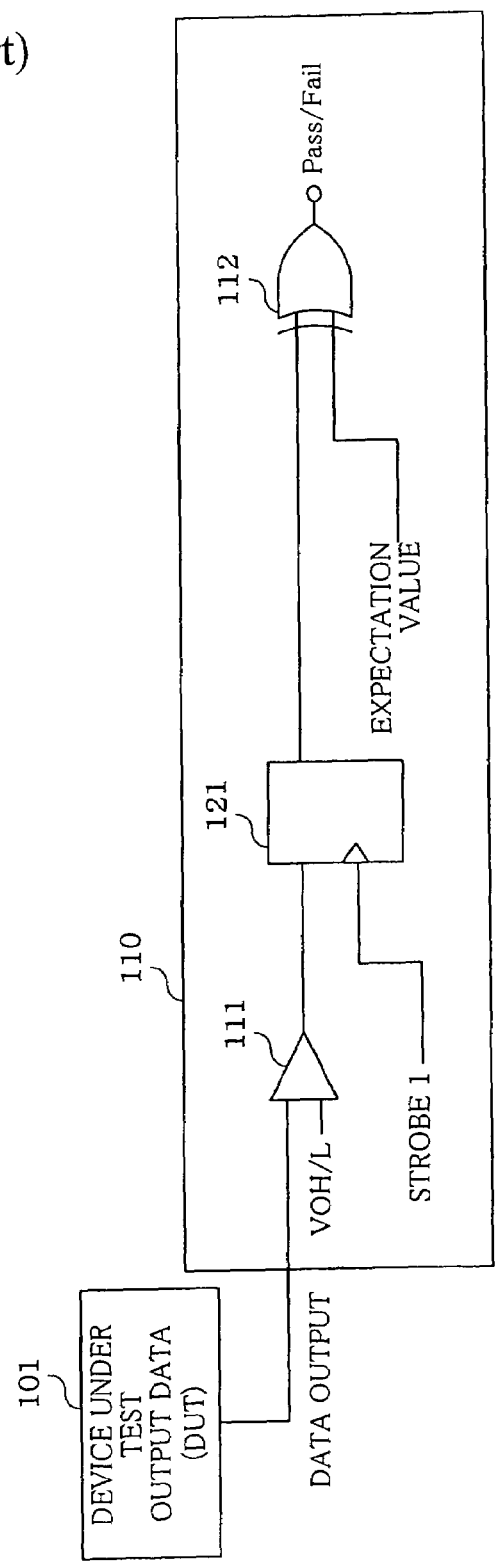
FIG. 7 is a block diagram showing a schematic structure of a conventional semiconductor test apparatus.

As a result, the subtraction circuit 61 can be switched between a case that the positional data output from the register 41a on the forefront stage and the positional data of one of the registers 41b to 41n on the next stage are input to be subjected to the subtraction processing (① Cycle To Cycle Jitter shown in FIG. 7), and a case that the positional data of the register 41a on the forefront stage and the positional data indicative of an average value calculated by the average value calculation circuit 44 are subjected to the subtraction processing (② Cycle to Smoothing Jitter shown in FIG. 7).

The jitter limit value register 62 stores a predetermined jitter limit value which is compared with a phase difference calculated by the subtraction circuit 61.

The comparison judgment circuit 63 compares a phase difference calculated by the subtraction circuit 61 with a jitter limit value stored in the jitter limit value register 62, and judges its acceptability (Pass/Fail). For example, when the phase difference calculated by the subtraction circuit 61 exceeds the jitter limit value, "Fail" is determined. When the phase difference does not exceed the jitter limit value, "Pass" is determined.

Then, a judgment result obtained by this comparison judgment circuit 63 is stored in, e.g., the fail analysis memory like the acceptability judgment result in the pattern comparator 12 described in conjunction with the first embodiment.

In this embodiment, as shown in FIG. 8, a judgment changeover switch 64 is provided to an input portion to the fail analysis memory or the like, and a mode to store the acceptability judgment result in the pattern comparator 12 ((1) Data Exp Mode shown in FIG. 8) can be switched to/from a mode to store the judgment result of the comparison judgment circuit 63 ((2) Jitter Fail Mode shown in the same drawing) as to the fail analysis memory or the like.

As described above, according to the semiconductor test apparatus of this embodiment, by providing the jitter detection circuit 60 which receives a plurality of recovery clocks, a phase difference between the recovery clocks can be detected by applying the subtraction processing to the positional data indicative of edge timings of the respective recovery clocks. Further, distribution of the phase differences detected by the jitter detection circuit 60 can be obtained, and it can be output as distribution data showing irregularities or spread of the phase differences.

The phase difference of the recovery clocks indicates a jitter of the clock signal multiplexed to the output data of the device under test 1, and the jitter analysis of the output data of the device under test 1 and the multiplexed clock can be performed by obtaining the phase difference between the recovery clocks and its distribution data.

As a result, in this embodiment, the highly accurate jitter analysis of the clock (or the output data) of the device under test can be easily, correctly and assuredly carried out without generating a problem such as an error due to an operation of, e.g., an oscilloscope or difficulties in a measurement operation which can be observed when, e.g., using an existing jitter measurement instrument.

Although the above has described the preferred embodiments of the semiconductor test apparatus according to the present invention, the semiconductor test apparatus according to the present invention is not restricted only to the foregoing embodiments, and it is needless to say that various modifications can be carried out within the scope of the present invention.

For example, although the test apparatus including the jitter detection circuit which obtains and analyzes jitters of the device under test has been described in the above-described second embodiment, means for detecting and analyzing jitters is not restricted to the jitter detection circuit described in the second embodiment, and any other jitter analyzing means can be provided.

For example, it is possible to provide a phase difference distribution circuit which receives a phase difference between recovery clocks detected by the jitter detection circuit described in the second embodiment, obtains a distribution of the phase difference, and outputs it as distribution data of the jitter of the output data from the LSI to be measured.

Furthermore, it is also possible to provide a jitter distribution circuit which receives positional data output from the time interpolator described in the first and second embodiment and a corresponding recovery clock output from the digital filter, detects a phase difference between edge timings indicated by the positional data and the recovery clock, and outputs it as distribution data of the jitter of the clock or the output data of the device under test.

That is, the clock recovery circuit constituting the semiconductor test apparatus according to the present invention can be obtained by combinations of any circuits, apparatus and others as long as it comprises the time interpolator which acquires output data of the device under test as time-series level data and the digital filter which can obtain and output a recovery clock based on the level data acquired by the time interpolator, and an application, an object and others as the semiconductor test apparatus are not limited to particular examples.

As described above, according to the semiconductor test apparatus of the present invention, by providing the time interpolator and the digital filter, a system clock output from the device under test can be acquired, and a recovery clock having a frequency of an internal clock faster than the system clock can be obtained with a timing of a rise edge or a fall edge of the system clock.

As a result, it is possible to assuredly perform a test of the device under test from which data is output with an edge timing of the system clock of the device under test and at a data rate of the internal clock faster than the system clock, and the semiconductor test apparatus suitable for a test of a high-speed device as typified by an ODR type device can be provided.

The invention claimed is:

1. A semiconductor test apparatus comprising:
    a first time interpolator which receives a clock output from a device under test, obtains the clock by using a plurality of strobes having specified timing intervals, outputs the obtain clock as time-series level data, selectively receives level data indicative of an edge timing of a rise edge and/or a fall edge of the level data, and outputs positional data indicative of an edge timing of the selected level data;
    a second time interpolator which receives output data output from the device under test, obtains the output data by using a plurality of strobes having specified timing intervals, and outputs the obtained output data as time-series level data;
    a digital filter which receives and holds the positional data output from the first time interpolator, and outputs a recovery clock indicative of a predetermined edge timing from one or more sets of the positional data; and
    a data selection circuit which receives the time-series level data output from the second time interpolator, selects the level data with an edge timing of the recovery clock output from the digital filter, and outputs the selected level data as measurement data of the device under test.

2. The semiconductor test apparatus according to claim 1, wherein:
    the first time interpolator comprises a plurality of sequence circuits which receive clocks output from the device under test and are connected with each other in parallel; a delay circuit which sequentially inputs strobes delayed at specified timing intervals to the plurality of sequence circuits, and outputs time-series level data from the sequence circuits; an edge selector which selectively outputs level data indicative of a rise edge, level data indicative of a fall edge or level data indicative of the rise edge and the fall edge of the time-series level data output from the plurality of sequence circuits; and an encoder which receives level data selected by the edge selector, encodes the selected level data into positional data indicative of an edge timing, and outputs the positional data, the digital filter comprises one or more registers connected with each other in serial which sequentially store the positional data output from the first time interpolator and output the stored positional data with a predetermined timing, and outputs a recovery clock indicative of a predetermined edge timing from one or more sets of the positional data output from the registers, the second time interpolator comprises a plurality of sequence circuits connected with each other in parallel which receive output data output from the device under test; and a delay circuit which sequentially inputs strobes delayed at specified timing intervals to the plurality of sequence circuits and outputs time-series level data from the sequence circuits, and the data selection circuit comprises a selector which selects one set of data from the time-series level data input from the second time interpolator with the recovery clock output from the digital filter being used as a selection signal and outputs the selected level data as measurement data of the device under test.

3. The semiconductor test apparatus according to claim 2, wherein the edge selector comprises one or more selector circuits each of which comprises: a first AND circuit which receives a reverse output of one sequence circuit and a non-reverse output of a sequence circuit on a next stage; a second AND circuit which receives a non-reverse output of one sequence circuit and a reverse output of a sequence circuit on a next stage; an OR circuit which receives outputs of the first and second AND circuits; and a selector which selects one of outputs of the first AND circuit, the second AND circuit and the OR circuit.

4. The semiconductor test apparatus according to claim 2, wherein the digital filter comprises an edge detection circuit which detects presence/absence of an edge of the positional data input from the first time interpolator and outputs the positional data stored in the register when the edge is detected.

5. The semiconductor test apparatus according to claim 4, wherein the register of the digital filter outputs the stored positional data with a predetermined timing irrespective of presence/absence of an edge of the positional data detected by the edge detection circuit.

6. The semiconductor test apparatus according to claim 2, wherein, when the two or more registers are provided, the digital filter comprises an average value calculation circuit which receives the positional data output from each of the two or more registers, calculates an average value of edge timings indicated by respective sets of the positional data, and outputs the average value as a recovery clock.

7. The semiconductor test apparatus according to claim 6, wherein the digital filter comprises an average value changeover switch which selects one of the positional data output from one register among the two or more registers and the average value output from the average value calculation circuit and outputs the selected output as a recovery clock.

8. The semiconductor test apparatus according to claim 2, wherein the digital filter comprises a timing correction circuit which adds a predetermined correction value to the positional data output from the register, corrects an edge timing indicated by the positional data and outputs the corrected edge timing as a recovery clock.

9. The semiconductor test apparatus according to claim 1, further comprising a jitter detection circuit which receives a plurality of recovery clocks output from the digital filter, detects a phase difference between edge timings indicated by the respective recovery clocks and obtains a jitter of the clock of the device under test.

10. The semiconductor test apparatus according to claim 1, further comprising a bus which connects the first and second time interpolators with each other and distributes data output from the first and second time interpolators to a predetermined data selection circuit.

* * * * *